United States Patent
Shindo

(10) Patent No.: US 10,254,648 B2
(45) Date of Patent: *Apr. 9, 2019

(54) RADIATION-SENSITIVE RESIN COMPOSITION, RESIN FILM, AND ELECTRONIC DEVICE

(71) Applicant: ZEON CORPORATION, Tokyo (JP)

(72) Inventor: Hiroaki Shindo, Tokyo (JP)

(73) Assignee: ZEON CORPORTION, Tokyo (JP)

( * ) Notice: Subject to any disclaimer, the term of this patent is extended or adjusted under 35 U.S.C. 154(b) by 8 days.

This patent is subject to a terminal disclaimer.

(21) Appl. No.: 14/913,468

(22) PCT Filed: Aug. 25, 2014

(86) PCT No.: PCT/JP2014/072110
§ 371 (c)(1),
(2) Date: Feb. 22, 2016

(87) PCT Pub. No.: WO2015/029930
PCT Pub. Date: Mar. 5, 2015

(65) Prior Publication Data
US 2016/0209744 A1 Jul. 21, 2016

(30) Foreign Application Priority Data

Aug. 27, 2013 (JP) ................. 2013-175460

(51) Int. Cl.
*C08F 2/46* (2006.01)
*C08F 2/50* (2006.01)
*C08G 61/04* (2006.01)
*G03F 7/037* (2006.01)
*G03F 7/023* (2006.01)
*G03F 7/027* (2006.01)
*G03F 7/032* (2006.01)
*G03F 7/033* (2006.01)
*G03F 7/075* (2006.01)
*G06F 3/041* (2006.01)

(52) U.S. Cl.
CPC ............ *G03F 7/037* (2013.01); *G03F 7/027* (2013.01); *G03F 7/0233* (2013.01); *G03F 7/032* (2013.01); *G03F 7/033* (2013.01); *G03F 7/0757* (2013.01); *G06F 3/041* (2013.01)

(58) Field of Classification Search
CPC ........ G03F 7/0233; G03F 7/032; G03F 7/037; G03F 3/041; G03F 7/027; G03F 7/0757; G06F 3/041

USPC .............. 522/6, 71, 189, 184, 1; 520/1
See application file for complete search history.

(56) References Cited

U.S. PATENT DOCUMENTS

| 9,574,090 B2 * | 2/2017 | Shindo | C09D 4/06 |
| 2002/0071929 A1 | 6/2002 | Ohgo | |
| 2012/0088189 A1 * | 4/2012 | Miyagishima | B82Y 30/00 430/280.1 |
| 2012/0237873 A1 * | 9/2012 | Fujiwara | C08G 77/14 430/280.1 |
| 2013/0237629 A1 * | 9/2013 | Doi | C08F 290/12 522/77 |

FOREIGN PATENT DOCUMENTS

| JP | 2002-148789 A | 5/2002 |
| JP | 2002-184043 A | 6/2002 |
| JP | 2005-500573 A | 1/2005 |
| JP | 2006-251009 * | 9/2006 |
| JP | 2006-251009 A | 9/2006 |
| JP | 2009-223293 A | 10/2009 |
| JP | 2010-197568 * | 9/2010 |
| JP | 2010-197568 A | 9/2010 |
| JP | 2011-90163 A | 5/2011 |
| JP | 2012-211988 A | 11/2012 |
| WO | 2011/078106 A1 | 6/2011 |
| WO | 2011/142391 A1 | 11/2011 |

OTHER PUBLICATIONS

Itami et al, JP 2006-251009 Machine Translation, Sep. 21, 2006 (Year: 2006).*
Senzaki et al, JP 2010-197568 Machine Translation, Sep. 9, 2010 (Year: 2010).*
International Preliminary Report on Patentability (Form PCT/IB/373) issued in counterpart International Application No. PCT/JP2014/072110 dated Mar. 1, 2016, with Form PCT/ISA/237. (8 pages).
International Search Report dated Sep. 22, 2014, issued in counterpart International Application No. PCT/JP2014/072110 (2 pages).

* cited by examiner

*Primary Examiner* — Jessica Whiteley
(74) *Attorney, Agent, or Firm* — Westerman, Hattori, Daniels & Adrian, LLP

(57) ABSTRACT

A radiation-sensitive resin composition comprising a binder resin (A), quinone diazide-based photoacid generator (B), (meth)acrylate compound (C), and photopolymerization initiator (D) is provided. According to the present invention, it is possible to provide a radiation-sensitive resin composition which can give a resin film which exhibits a high adhesion to a substrate and is excellent in transparency, photosensitivity, and chemical resistance.

10 Claims, No Drawings

RADIATION-SENSITIVE RESIN COMPOSITION, RESIN FILM, AND ELECTRONIC DEVICE

TECHNICAL FIELD

The present invention relates to a radiation-sensitive resin composition and a resin film and electronic device which are obtained using this radiation-sensitive resin composition, more particularly relates to a radiation-sensitive resin composition which can give a resin film which exhibits a high adhesion to a substrate and is excellent in transparency, photosensitivity, and chemical resistance and to a resin film and electronic device which are obtained using this radiation-sensitive resin composition.

BACKGROUND ART

A touch pallet or flexible organic EL display or other display device which is provided with a touch panel structure or an integrated circuit device, solid state imaging device, color filter, black matrix, or other electronic device is provided with a protective film for preventing deterioration or damage, a flattening film for flattening the device surface or interconnects, an electric insulating film for ensuring the electrical insulation property, etc. constituted by various types of resin films.

In the past, as the resin materials for forming such resin films, epoxy resins and other heat curable resin materials have been generally used. In recent years, along with the higher density of interconnects and devices, development of new resin materials excellent in low dielectric constant and other electrical characteristics has been sought for these resin materials as well.

To deal with such demands, for example, Patent Document 1 discloses a radiation-sensitive resin composition containing a cyclic olefin polymer which has a protonic polar group, unsaturated group-containing compound, silane-modified organic-inorganic hybrid compound, and radical-generating photopolymerization initiator.

PRIOR ART DOCUMENTS

Patent Documents

Patent Document 1: Japanese Patent Publication No. 2012-211988A

SUMMARY OF THE INVENTION

Problem to be Solved by the Invention

According to the radiation-sensitive resin composition disclosed in Patent Document 1, a resin film which is excellent in transparency etc. can be given, but the adhesion to a soda glass substrate or other transparent substrate is not necessarily sufficient. For this reason, this was not suitable for use for applications in which resin materials excellent in adhesion to a soda glass substrate or other transparent substrate were sought, for example, an application of a protective film or an electrical insulating film of a display device provided with a touch panel structure.

Therefore, the present invention has as its object the provision of a radiation-sensitive resin composition which can give a resin film which exhibits high adhesion to a substrate and is excellent in transparency, photosensitivity, and chemical resistance. Further, the present invention has as its object the provision of a resin film which is obtained using such a radiation-sensitive resin composition and an electronic device which is provided with that resin film.

Means for Solving the Problems

The present inventors engaged in intensive research for achieving the above objects and as a result discovered that the above objects can be achieved by a radiation-sensitive resin composition which contains a binder resin, quinone diazide-based photoacid generator, (meth)acrylate compound, and photopolymerization initiator and thereby completed the present invention.

That is, according to the present invention, there are provided:

[1] A radiation-sensitive resin composition containing a binder resin (A), quinone diazide-based photoacid generator (B), (meth)acrylate compound (C), and photopolymerization initiator (D),

[2] The radiation-sensitive resin composition according to [1] wherein a ratio of content of the (meth)acrylate compound (C) is 0.3 to 22 parts by weight with respect to 100 parts by weight of the binder resin (A),

[3] The radiation-sensitive resin composition according to [1] or [2] wherein the binder resin (A) is a cyclic olefin polymer which has a protonic polar group (A1), acrylic resin (A2), Cardo resin (A3), polysiloxane (A4), or polyimide (A5),

[4] The radiation-sensitive resin composition according to any one of [1] to [3] wherein the photopolymerization initiator (D) is a radical generating type photopolymerization initiator, and a content of the photopolymerization initiator (D) is 0.3 to 8 parts by weight with respect to 100 parts by weight of the binder resin (A),

[5] The radiation-sensitive resin composition according to any one of [1] to [4] wherein the (meth)acrylate compound (C) contains at least a tetrafunctional or higher functional (meth)acrylate,

[6] The radiation-sensitive resin composition according to [5] wherein the (meth)acrylate compound (C) is a combination of a tetrafunctional or higher functional (meth)acrylate and a monofunctional (meth)acrylate,

[7] The radiation-sensitive resin composition according to any one of [1] to [6] further containing a cross-linking agent (E),

[8] A resin film obtained using the radiation-sensitive resin composition according to any one of [1] to [7],

[9] An electronic device comprising the resin film according to [8], and

[10] A display device comprising a touch panel structure which is provided with an insulating film and/or protective film comprised of the resin film according to [8].

Effects of the Invention

According to the present invention, it is possible to provide a radiation-sensitive resin composition which can give a resin film which exhibits high adhesion to a substrate and is excellent in transparency, photosensitivity, and chemical resistance, a resin film which is obtained using such a radiation-sensitive resin composition, and an electronic device which is provided with that resin film.

DESCRIPTION OF EMBODIMENTS

The radiation-sensitive resin composition of the present invention contains a binder resin (A), quinone diazide-based photoacid generator (B), (meth)acrylate compound (C), and photopolymerization initiator (D).

(Binder Resin (A))

The binder resin (A) used in the present invention is not particularly limited, but a cyclic olefin polymer which has a protonic polar group (A1), an acrylic resin (A2), Cardo resin (A3), polysiloxane (A4), or polyimide (A5) is preferable. Among these as well, from the viewpoint of being able to improve the adhesion to a substrate more, a cyclic olefin polymer which has a protonic polar group (A1) is particularly preferable. These binder resins (A) may respectively be used alone or as two types or more combined.

As the cyclic olefin polymer which has a protonic polar group (A1) (below, simply referred to as the "cyclic olefin polymer (A1)"), a polymer of one or more cyclic olefin monomers or a copolymer of one or more cyclic olefin monomers and a monomer which can copolymerize with them may be mentioned, but in the present invention, as the monomer for forming the cyclic olefin polymer (A1), it is preferable to use at least a cyclic olefin monomer which has a protonic polar group (a).

Here, the "protonic polar group" means a group which contains an atom belonging to Group XV or Group XVI of the Periodic Table to which a hydrogen atom directly bonds. Among the atoms belonging to Group XV or Group XVI of the Periodic Table, atoms belonging to Period 1 or Period 2 of Group XV or Group XVI of the Periodic Table are preferable, an oxygen atom, nitrogen atom, or sulfur atom is more preferable, and an oxygen atom is particularly preferable.

As specific examples of such a protonic polar group, a hydroxyl group, carboxy group (hydroxycarbonyl group), sulfonic acid group, phosphoric acid group, and other polar groups which have oxygen atoms; primary amino group, secondary amino group, primary amide group, secondary amide group (imide group), and other polar groups which have nitrogen atoms; a thiol group and other polar groups which have sulfur atoms; etc. may be mentioned. Among these as well, ones which have oxygen atoms are preferable, carboxy group is more preferable. In the present invention, the number of protonic polar groups which bond with the cyclic olefin resin which has protonic polar groups is not particularly limited. Further, different types of protonic polar groups may also be included.

As specific examples of the cyclic olefin monomer which has a protonic polar group (a) (below, suitably called the "monomer (a)"), 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylmethylbicyclo[2.2.1]hept-5-ene, 2-hydroxycarbonyl-2-propoxycarbonylmethylbicyclo[2.2.1]hept-5-ene, 2-hydroxycarbonyl-2-butoxycarbonylmethylbicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1]hept-5-ene, 2-hydroxycarbonyl-2-naphthyloxycarbonylmethylbicyclo[2.2.1]hept-5-ene, 2-hydroxycarbonyl-2-biphenyloxycarbonylmethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyl oxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.1]hept-5-ene, 2-hydroxycarbonyl-3-biphenyloxycarbonylbicyclo[2.2.1]hept-5-ene, 2-hydroxycarbonyl-3-benzyloxycarbonylbicyclo[2.2.1]hept-5-ene, 2-hydroxycarbonyl-3-hydroxyethoxycarbonylbicyclo[2.2.1]hept-5-ene, 2-hydroxycarbonyl-3-hydroxycarbonylmethylbicyclo[2.2.1]hept-5-ene, 3-methyl-2-hydroxycarbonylbicyclo[2.2.1]hept-5-ene, 3-hydroxymethyl-2-hydroxycarbonylbicyclo[2.2.1]hept-5-ene, 2-hydroxycarbonyltricyclo[5.2.1.0$^{2,6}$]deca-3,8-diene, 4-hydroxycarbonyltetracyclo[6.2.1.1$^{3,6}$.0$^{2,7}$]dodec-9-ene, 4-methyl-4-hydroxycarbonyltetracyclo[6.2.1.1$^{3,6}$.0$^{2,7}$]dodec-9-ene, 4,5-dihydroxycarbonyltetracyclo[6.2.1.1$^{3,6}$.0$^{2,7}$]dodec-9-ene, 4-carboxymethyl-4-hydroxycarbonyltetracyclo[6.2.1.1$^{3,6}$.0$^{2,7}$]dodec-9-ene, N-(hydroxycarbonylmethyl)bicyclo[2.2.1]hept-5-ene-2,3-dicarboxyimide, N-(hydroxycarbonylethyl)bicyclo[2.2.1]hept-5-ene-2,3-dicarboxyimide, N-(hydroxycarbonylpentyl)bicyclo[2.2.1]hept-5-ene-2,3-dicarboxyimide, N-(dihydroxycarbonylethyl)bicyclo[2.2.1]hept-5-ene-2,3-dicarboxyimide, N-(dihydroxycarbonylpropyl)bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydroxycarbonyl)ethyl)bicyclo[2.2.1]hept-5-ene-2,3-dicarboxyimide, N-(hydroxycarbonylphenyl)bicyclo[2.2.1]hept-5-ene-2,3-dicarboxyimide, and other carboxy group-containing cyclic olefins; 2-(4-hydroxyphenyl)bicyclo[2.2.1]hept-5-ene, 2-methyl-2-(4-hydroxyphenyl)bicyclo[2.2.1]hept-5-ene, 4-(4-hydroxyphenyl)tetracyclo[6.2.1.1$^{3,6}$.0$^{2,7}$]dodec-9-ene, 4-methyl-4-(4-hydroxyphenyl)tetracyclo[6.2.1.1$^{3,6}$.0$^{2,7}$]dodec-9-ene, 2-hydroxybicyclo[2.2.1]hept-5-ene, 2-hydroxymethylbicyclo[2.2.1]hept-5-ene, 2-hydroxyethylbicyclo[2.2.1]hept-5-ene, 2-methyl-2-hydroxymethylbicyclo[2.2.1]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluoromethyl-3,3,3-trifluoropropyl)bicyclo[2.2.1]hept-5-ene, 3-hydroxytricyclo[5.2.1.0$^{2,6}$]deca-4,8-diene, 3-hydroxymethyltricyclo[5.2.1.0$^{2,6}$]deca-4,8-diene, 4-hydroxytetracyclo[6.2.1.1$^{3,6}$.0$^{2,7}$]dodec-9-ene, 4-hydroxymethyltetracyclo[6.2.1.1$^{3,6}$.0$^{2,7}$]dodec-9-ene, 4,5-dihydroxymethyltetracyclo[6.2.1.1$^{3,6}$.0$^{2,7}$]dodec-9-ene, 4-(hydroxyethoxycarbonyl)tetracyclo[6.2.1.1$^{3,6}$.0$^{2,7}$]dodec-9-ene, 4-methyl-4-(hydroxyethoxycarbonyl)tetracyclo[6.2.1.1$^{3,6}$.0$^{2,7}$]dodec-9-ene, N-(hydroxyethyl)bicyclo[2.2.1]hept-5-ene-2,3-dicarboxyimide, N-(hydroxyphenyl)bicyclo[2.2.1]hept-5-ene-2,3-dicarboxyimide, and other hydroxyl group-containing cyclic olefins etc. may be mentioned. Among these as well, from the viewpoint of the adhesion of the obtained resin film becoming higher, carboxy group-containing cyclic olefins are preferable, while 4-hydroxycarbonyltetracyclo[6.2.1.1$^{3,6}$.0$^{2,7}$]dodec-9-ene is particularly preferable. These monomers (a) may respectively be used alone or may be used as two types or more combined.

In the cyclic olefin polymer (A1), the ratio of content of the units of the monomer (a) is preferably 10 to 90 mol % with respect to all monomer units. By the ratio of content of the units of the monomer (a) being in this range, the radiation-sensitive resin composition of the present invention can be improved in radiation sensitivity, formation of undissolved residue at the time of development, and solubility in a polar solvent with a good balance.

Further, the cyclic olefin polymer (A1) used in the present invention may be a copolymer which is obtained by copolymerization of a cyclic olefin monomer which has a protonic polar group (a) and a monomer (b) which can copolymerize with this. As such a copolymerizable monomer, a cyclic olefin monomer which has a polar group other than a protonic polar group (b1), a cyclic olefin monomer which does not have a polar group (b2), and a monomer other than a cyclic olefin (b3) (below, suitably called the "monomer (b1)", "monomer (b2)", and "monomer (b3)") may be mentioned.

As the cyclic olefin monomer which has a polar group other than a protonic polar group (b1), for example, a cyclic olefin which has an N-substituted imide group, ester group, cyano group, acid anhydride group, or halogen atom may be mentioned.

As a cyclic olefin which has an N-substituted imide group, for example, a monomer represented by the following formula (1) or a monomer represented by the following formula (2) may be mentioned.

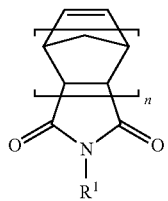

(1)

(In the above formula (1), $R^1$ indicates a hydrogen atom or $C_1$ to $C_{16}$ alkyl group or aryl group. "n" indicates an integer of 1 to 2.)

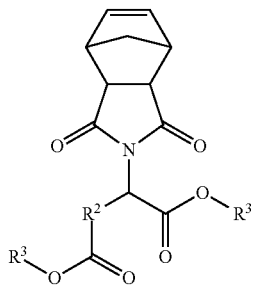

(2)

(In the above formula (2), $R^2$ indicates a $C_1$ to $C_3$ bivalent alkylene group, while $R^3$ indicates a $C_1$ to $C_{10}$ monovalent alkyl group or a $C_1$ to $C_{10}$ monovalent halogenated alkyl group.)

In the above formula (1), $R^1$ is a $C_1$ to $C_{15}$ alkyl group or aryl group. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, and other straight chain alkyl groups; cyclopropyl group, cyclobutyl group, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, 1-methylnonyl group, 1-methyltridecyl group, 1-methyltetradecyl group, and other branched alkyl groups; etc. may be mentioned. Further, as specific examples of the aryl group, a benzyl group etc. may be mentioned. Among these as well, due to the more excellent heat resistance and solubility in a polar solvent, a $C_6$ to $C_{14}$ alkyl group and aryl group are preferable, while a $C_6$ to $C_{10}$ alkyl group and aryl group are more preferable. If the number of carbon atoms is 4 or less, the solubility in a polar solvent is inferior, while if the number of carbon atoms is 17 or more, the heat resistance is inferior. Further, when patterning the resin film, there is the problem that the resin film melts by heat and the patterns to end up disappearing.

As specific examples of the monomer represented by the above formula (1), bicyclo[2.2.1]hept-5-ene-2,3-dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)-bicyclo[2.2.1]hept-5-ene-2,3-dicarboxyimide, N-(2-methylbutyl)-bicyclo[2.2.1]hept-5-ene-2,3-dicarboxyimide, N-(1-methylpentyl)-bicyclo[2.2.1]hept-5-ene-2,3-dicarboxyimide, N-(2-methylpentyl)-bicyclo[2.2.1]hept-5-ene-2,3-dicarboxyimide, N-(1-ethylbutyl)-bicyclo[2.2.1]hept-5-ene-2,3-dicarboxyimide, N-(2-ethylbutyl)-bicyclo[2.2.1]hept-5-ene-2,3-dicarboxyimide, N-(1-methylhexyl)-bicyclo[2.2.1]hept-5-ene-2,3-dicarboxyimide, N-(2-methylhexyl)-bicyclo[2.2.1]hept-5-ene-2,3-dicarboxyimide, N-(3-methylhexyl)-bicyclo[2.2.1]hept-5-ene-2,3-dicarboxyimide, N-(1-butylpentyl)-bicyclo[2.2.1]hept-5-ene-2,3-dicarboxyimide, N-(2-butylpentyl)-bicyclo[2.2.1]hept-5-ene-2,3-dicarboxyimide, N-(1-methylheptyl)-bicyclo[2.2.1]hept-5-ene-2,3-dicarboxyimide, N-(2-methylheptyl)-bicyclo[2.2.1]hept-5-ene-2,3-dicarboxyimide, N-(3-methylheptyl)-bicyclo[2.2.1]hept-5-ene-2,3-dicarboxyimide, N-(4-methylheptyl)-bicyclo[2.2.1]hept-5-ene-2,3-dicarboxyimide, N-(1-ethylhexyl)-bicyclo[2.2.1]hept-5-ene-2,3-dicarboxyimide, N-(2-ethylhexyl)-bicyclo[2.2.1]hept-5-ene-2,3-dicarboxyimide, N-(3-ethylhexyl)-bicyclo[2.2.1]hept-5-ene-2,3-dicarboxyimide, N-(1-propylpentyl)-bicyclo[2.2.1]hept-5-ene-2,3-dicarboxyimide, N-(2-propylpentyl)-bicyclo[2.2.1]hept-5-ene-2,3-dicarboxyimide, N-(1-methyloctyl)-bicyclo[2.2.1]hept-5-ene-2,3-dicarboxyimide, N-(2-methyloctyl)-bicyclo[2.2.1]hept-5-ene-2,3-dicarboxyimide, N-(3-methyloctyl)-bicyclo[2.2.1]hept-5-ene-2,3-dicarboxyimide, N-(4-methyloctyl)-bicyclo[2.2.1]hept-5-ene-2,3-dicarboxyimide, N-(1-ethylheptyl)-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)-bicyclo[2.2.1]hept-5-ene-2,3-dicarboxyimide, N-(4-ethylheptyl)-bicyclo[2.2.1]hept-5-ene-2,3-dicarboxyimide, N-(1-propylhexyl)-bicyclo[2.2.1]hept-5-ene-2,3-dicarboxyimide, N-(2-propylhexyl)-bicyclo[2.2.1]hept-5-ene-2,3-dicarboxyimide, N-(3-propylhexyl)- bicyclo[2.2.1]hept-5-ene-2,3-dicarboxyimide, N-(1-methylnonyl)-bicyclo[2.2.1]hept-5-ene-2,3-dicarboxyimide, N-(2-methylnonyl)-bicyclo[2.2.1]hept-5-ene-2,3-dicarboxyimide, N-(3-methylnonyl)-bicyclo[2.2.1]hept-5-ene-2,3-dicarboxyimide, N-(4-methylnonyl)-bicyclo[2.2.1]hept-5-ene-2,3-dicarboxyimide, N-(5-methylnonyl)-bicyclo[2.2.1]hept-5-ene-2,3-dicarboxyimide, N-(1-ethyloctyl)-bicyclo[2.2.1]hept-5-ene-2,3-dicarboxyimide, N-(2-ethyloctyl)-bicyclo[2.2.1]hept-5-ene-2,3-dicarboxyimide, N-(3-ethyloctyl)-bicyclo[2.2.1]hept-5-ene-2,3-dicarboxyimide, N-(4-ethyloctyl)-bicyclo[2.2.1]hept-5-ene-2,3-dicarboxyimide, N-(1-methyldecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methylundecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methyltridecyl)-bicyclo[2.2.1]hept-5-ene-2,3-dicarboxyimide, N-(1-methyltetradecyl)-bicyclo[2.2.1]hept-5-ene-2,3-dicarboxyimide, N-(1-methylpentadecyl)-bicyclo[2.2.1]hept-5-ene-2,3-dicarboxyimide, N-phenyl-tetracyclo[6.2.1.1$^{3,6}$.0$^{2,7}$]dodec-9-ene-4,5-dicarboxyimide, N-(2,4-dimethoxyphenyl)-tetracyclo[6.2.1.1$^{3,6}$.0$^{2,7}$]dodec-9-ene-4,5-dicarboxyimide, etc. may be mentioned. Note that, these may respectively be used alone or may be used as two types or more combined.

On the other hand, in the above formula (2), $R^2$ is a $C_1$ to $C_3$ bivalent alkylene group. As the $C_1$ to $C_3$ bivalent alkylene group, a methylene group, ethylene group, propylene group, and isopropylene group may be mentioned. Among these as well, due to the excellent polymerization activity, a methylene group and ethylene group are preferable.

Further, in the above formula (2), $R^3$ is a $C_1$ to $C_{10}$ monovalent alkyl group or $C_1$ to $C_{10}$ monovalent halogenated alkyl group. As the $C_1$ to $C_{10}$ monovalent alkyl group, for example, a methyl group, ethyl group, propyl group, isopropyl group, butyl group, sec-butyl group, tert-butyl group, hexyl group, cyclohexyl group, etc. may be mentioned. As the $C_1$ to $C_{10}$ monovalent halogenated alkyl group, for example, a fluoromethyl group, chloromethyl group, bromomethyl group, difluoromethyl group, dichloromethyl group, difluoromethyl group, trifluoromethyl group, trichloromethyl group, 2,2,2-trifluoroethyl group, pentafluoroethyl group, heptafluoropropyl group, perfluorobutyl group, perfluoropentyl group, etc. may be mentioned. Among these as well, since the solubility in a polar solvent is excellent, as $R^3$, a methyl group or ethyl group is preferable.

Note that, the monomer represented by the above formulas (1) and (2) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 2-acetoxybicyclo[2.2.1]hept-5-ene, 2-acetoxymethylbicyclo[2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo[2.2.1]hept-5-ene, 2-cyclohexyloxycarbonylbicyclo[2.2.1]hept-5-ene, 2-methyl-2-methoxycarbonylbicyclo[2.2.1]hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo[2.2.1]hept-5-ene, 2-methoxycarbonyltricyclo[5.2.1.0$^{2,6}$]dec-8-ene, 2-ethoxycarbonyltricyclo[5.2.1.0$^{2,6}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltetracyclo[6.2.1.1$^{3,6}$.0$^{2,7}$]dodec-9-ene, 4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyl tetracyclo[6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyl tetracyclo[6.2.1.1$^{3,6}$.0$^{2,7}$]dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo[6.2.1.1$^{3,6}$.0$^{2,7}$]dodec-9-ene, etc. may be mentioned.

As the cyclic olefin which has a cyano group, for example, 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1]hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-9-ene-4,5-dicarboxylic anhydride, bicyclo[2.2.1]hept-5-ene-2,3-dicarboxylic anhydride, 2-carboxymethyl-2-hydroxycarbonylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1]hept-5-ene, 4-chlorotetracyclo[6.2.1.1$^{3,6}$.0$^{2,7}$]dodec-9-ene, 4-methyl-4-chlorotetracyclo[6.2.1.1$^{3,6}$.0$^{2,7}$]dodec-9-ene, etc. may be mentioned.

These monomers (b1) may respectively be used alone or may be used as two types or more combined.

As the cyclic olefin monomer which does not have a polar group (b2), bicyclo[2.2.1]hept-2-ene (also called "norbornene"), 5-ethylbicyclo[2.2.1]hept-2-ene, 5-butyl-bicyclo[2.2.1]hept-2-ene, 5-ethyl idene-bicyclo[2.2.1]hept-2-ene, 5-methyl idene-bicyclo[2.2.1]hept-2-ene, 5-vinyl-bicyclo[2.2.1]hept-2-ene, tricyclo[5.2.1.0$^{2,6}$]deca-3,8-diene (common name: dicyclopentadiene), tetracyclo[10.2.1.0$^{2,11}$.0$^{4,9}$]pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo[6.2.1.1$^{3,6}$.0$^{2,7}$]dodec-4-ene, 9-methyl idene-tetracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-vinyl-tetracyclo[6.2.1.1$^{3,6}$.0$^{2,7}$]dodec-4-ene, 9-propenyl-tetracyclo[6.2.1.1$^{3,6}$.0$^{2,7}$]dodec-4-ene, pentacyclo[9.2.1.1$^{3,9}$.0$^{2,10}$.0$^{4,8}$]pentadeca-5,12-diene, cyclobutene, cyclopentene, cyclopentadiene, cyclohexene, cycloheptene, cyclooctene, cyclooctadiene, indene, 3a, 5,6,7α-tetrahydro-4,7-methano-1H-indene, 9-phenyl-tetracyclo[6.2.1.1$^{3,6}$.0$^{2,7}$]dodec-4-ene, tetracyclo[9.2.1.0$^{2,19}$.0$^{3,8}$]tetradec-3,5,7,12-tetraene, pentacyclo[9.2.1.1$^{3,9}$.0$^{2,10}$.0$^{4,8}$]pentadec-12-ene, etc. may be mentioned. These monomers (b2) may respectively be used alone or may be used as two types or more combined.

As specific examples of the monomer other than a cyclic olefin (b3), ethylene; propylene, 1-butene, 1-pentene, 1-hexene, 3-methyl-1-butene, 3-methyl-1-pentene, 3-ethyl-1-pentene, 4-methyl-1-pent ene, 4-methyl-1-hexene, 4,4-dimethyl-1-hexene, 4,4-dimethyl-1-pent ene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ α-olefins; 1,4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable. These monomers (b3) may respectively be used alone or may be used as two types or more combined.

Among these monomers (b1) to (b3) as well, from the viewpoint of the effect of the present invention becoming more remarkable, a cyclic olefin monomer which has a polar group other than a protonic polar group (b1) is preferable, while a cyclic olefin which has an N-substituted imide group is particularly preferable.

In the cyclic olefin polymer (A1), the ratio of content of units of the copolymerizable monomer (b) is preferably 10 to 90 mol % with respect to the total monomer units. If the ratio of content of the units of the copolymerizable monomer (b) is too small, the cyclic olefin polymer (A1) is liable to become insufficient in solubility in a polar solvent, while if too great, the radiation-sensitive resin composition of the present invention is liable to become insufficient in radiation sensitivity and undissolved residue is liable to be formed at the time of development.

Note that, in the present invention, it is also possible to introduce a protonic group in a cyclic olefin-based polymer which does not have a protonic polar group utilizing a known modifying agent so as to obtain the cyclic olefin polymer (A1). The polymer which does not have a protonic polar group can be obtained by polymerizing at least one of the above-mentioned monomers (b1) and (b2) and, in accordance with need, a monomer (b3) in any combination.

Note that, the cyclic olefin polymer (A1) used in the present invention may be a ring-opened polymer obtained by ring-opening polymerization of the above-mentioned monomers or may be an addition polymer obtained by addition polymerization of the above-mentioned monomers, but from the viewpoint of the effect of the present invention becoming more remarkable, a ring-opened polymer is preferable.

A ring-opened polymer can be produced by ring-opening methathesis polymerization of a cyclic olefin monomer which has a protonic polar group (a) and a copolymerizable monomer (b) used according to need in the presence of a methathesis reaction catalyst. As the method of production, for example, the method described in International Publication No. 2010/110323A, [0039] to [0079], etc. can be used. On the other hand, an addition polymer can be obtained by causing polymerization of a cyclic olefin monomer which has a protonic polar group (a) and a copolymerizable monomer (b) used according to need using a known additional polymerization catalyst, for example, a catalyst comprised of a compound of titanium, zirconium, or vanadium and an organic aluminum compound.

Further, when the cyclic olefin polymer (A1) used in the present invention is a ring-opened polymer, it is preferable to further perform a hydrogenation reaction and obtain a hydrogenated product in which the carbon-carbon double bonds which are contained in the main chain are hydrogenated. When the cyclic olefin polymer (A1) is a hydrogenated product, the ratio of the hydrogenated carbon-carbon double bonds (hydrogenation rate) is usually 50% or more. From the viewpoint of the heat resistance, 70% or more is preferable, 90% or more is more preferable, and 95% or more is furthermore preferable.

Further, the acrylic resin (A2) used in the present invention is not particularly limited, but a homopolymer or copolymer having at least one of a carboxylic acid which has an acryl group, carboxylic anhydride which has an acryl group, epoxy group-containing acrylate compound and oxetane group-containing acrylate compound as an essential ingredient is preferable.

As specific examples of the carboxylic acid which has an acryl group, (meth)acrylic acid (meaning acrylic acid and/or methacrylic acid, below, same for methyl(meth)acrylate etc.), crotonic acid, maleic acid, fumaric acid, citraconic acid, mesaconic acid, glutaconic acid, phthalic acid mono-(2-((meth)acryloyloxy)ethyl), N-(carboxyphenyl) maleimide, N-(carboxyphenyl) (meth)acrylamide, etc. may be mentioned. As specific examples of the carboxylic anhydride which has an acryl group, maleic anhydride, citraconic anhydride, etc. may be mentioned.

As specific examples of the epoxy group-containing acrylate compound, glycidyl acrylate, glycidyl methacrylate, glycidyl α-ethyl acrylate, glycidyl α-n-propyl acrylate, glycidyl α-n-butyl acrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyacrylate, 3,4-epoxycyclohexylmethyl acrylate, 3,4-epoxycyclohexylmethyl methacrylate, etc. may be mentioned.

As specific examples of the oxetane group-containing acrylate compound, (3-methyloxetan-3-yl)methyl (meth)acrylate, (3-ethyloxetan-3-yl)methyl (meth)acrylate, (3-methyloxetan-3-yl)ethyl (meth)acrylate, (3-ethyloxetan-3-yl)ethyl (meth)acrylate, (3-chloromethyloxetan-3-yl) methyl (meth)acrylate, (oxetan-2-yl)methyl (meth)acrylate, (2-methyloxetan-2-yl)methyl (meth)acrylate, (2-ethyloxetan-2-yl)methyl (meth)acrylate, (1-methyl-1-oxetanyl-2-phenyl)-3-(meth)acrylate, (1-methyl-1-oxetanyl)-2-trifluoromethyl-3-(meth)acrylate, and (1-methyl-1-oxetanyl)-4-trifluoromethyl-2-(meth)acrylate, etc. may be mentioned. Among these as well, (meth)acrylic acid, maleic anhydride, glycidyl (meth)acrylate, 6,7-epoxyheptyl methacrylate, etc. are preferable.

The acrylic resin (A2) may also be a copolymer of at least one compound which is selected from unsaturated carboxylic acids, unsaturated carboxylic anhydrides, and epoxy group-containing unsaturated compounds, and other acrylate-based monomers or copolymerizable monomers other than acrylates.

As other acrylate-based monomers, methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, amyl (meth)acrylate, isoamyl (meth)acrylate, hexyl (meth)acrylate, heptyl (meth)acrylate, octyl (meth)acrylate, isooctyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, and other alkyl (meth)acrylates; hydroxyethyl (meth)acrylate, 2-hydroxypropyl (meth) acrylate, 3-hydroxypropyl (meth)acrylate, 2-hydroxybutyl (meth)acrylate, 3-hydroxybutyl (meth)acrylate, 4-hydroxybutyl (meth)acrylate, and other hydroxyalkyl (meth)acrylates; phenoxyethyl (meth)acrylate, 2-hydroxy-3-phenoxypropyl (meth)acrylate, and other phenoxyalkyl (meth) acrylates; 2-methoxyethyl (meth)acrylate, 2-ethoxyethyl (meth)acrylate, 2-propoxyethyl (meth)acrylate, 2-butoxyethyl (meth)acrylate, 2-methoxybutyl (meth)acrylate, and other alkoxyalkyl (meth)acrylates; polyethylene glycol mono(meth)acrylate, ethoxydiethylene glycol (meth)acrylate, methoxypolyethylene glycol (meth)acrylate, phenoxypolyethylene glycol (meth)acrylate, nonyl phenoxypolyethylene glycol (meth)acrylate, polypropylene glycol mono (meth)acrylate, methoxypolypropylene glycol (meth) acrylate, ethoxypolypropylene glycol (meth)acrylate, nonylphenoxypolypropylene glycol (meth)acrylate, and other polyalkylene glycol (meth)acrylates; cyclohexyl (meth)acrylate, 2-methyl cyclohexyl (meth)acrylate, 4-butylcyclohexyl (meth)acrylate, 1-adamantyl (meth)acrylate, 2-methyl-2-adamantyl (meth)acrylate, 2-ethyl-2-adamantyl (meth)acrylate, tricyclo[5.2.1.0$^{2,6}$]decan-8-yl (meth)acrylate, tricyclo[5.2.1.0$^{2,6}$]-3-decen-8-yl (meth)acrylate, tricyclo[5.2.1.0$^{2,6}$]-3-decen-9-yl (meth)acrylate, bornyl (meth) acrylate, isobornyl (meth)acrylate, and other cycloalkyl (meth)acrylates; phenyl (meth)acrylate, naphthyl (meth)acrylate, biphenyl (meth)acrylate, benzyl (meth)acrylate, tetrahydrofurfuryl (meth)acrylate, 5-tetrahydrofurfuryl oxycarbonylpentyl (meth)acrylate, vinyl (meth)acrylate, allyl (meth)acrylate, 2-(2-vinyloxyethoxy)ethyl (meth)acrylate, 2-[tricyclo[5.2.1.0$^{2,6}$]decan-8-yloxy]ethyl (meth)acrylate, 2-[tricyclo[5.2.1.0$^{2,6}$]-3-decen-8-yloxy]ethyl (meth)acrylate, 2-[tricyclo[5.2.1.0$^{2,6}$]-3-decen-9-yloxy]ethyl (meth)acrylate, γ-butyrolactone (meth)acrylate, maleimide, N-methylmaleimide, N-ethylmaleimide, N-butylmaleimide, N-cyclohexylmaleimide, N-benzylmaleimide, N-phenylmaleimide, N-(2,6-diethylphenyl)maleimide, N-(4-acetylphenyl)maleimide, N-(4-hydroxyphenyl)maleimide, N-(4-acetoxyphenyl)maleimide, N-(4-dimethylamino-3,5-dinitrophenyl)maleimide, N-(1-anilinonaphthyl-4)maleimide, N-[4-(2-benzooxazolyl)phenyl]maleimide, N-(9-acridinyl)maleimide, etc. may be mentioned. Among these as well, methyl (meth)acrylate, butyl (meth)acrylate, cyclohexyl (meth)acrylate, 2-methyl cyclohexyl (meth)acrylate, benzyl (meth)acrylate, tricyclo[5.2.1.0$^{2,6}$]decan-8-yl (meth)acrylate, N-phenylmaleimide, N-cyclohexylmaleimide, etc. are preferable.

The copolymerizable monomer other than acrylate is not particularly limited so long as a compound which can copolymerize with the above carboxylic acid which has an acryl group, carboxylic anhydride which has an acryl group, epoxy group-containing acrylate compound, but, for example, vinylbenzylmethyl ether, vinylglycidyl ether, styrene, α-methylstyrene, vinyltoluene, indene, vinylnaphthalene, vinylbiphenyl, chlorostyrene, bromostyrene, chloromethylstyrene, p-tert-butoxystyrene, p-hydroxystyrene, p-hydroxy-α-methyl styrene, p-acetoxystyrene, p-carboxystyrene, 4-hydroxyphenylvinylketone, acrylonitrile, methacrylonitrile, (meth)acrylamide, 1,2-epoxy-4-vinyl cyclohexane, isobutene, norbornene, butadiene, isoprene, and other radical polymerizable compounds may be mentioned. These compounds may respectively be used alone or may be used as two types or more combined. The polymerization method of the above monomer may be an ordinary method. For example, the suspension polymerization method, the emulsion polymerization method, the solution polymerization method, etc. may be employed.

The Cardo resin (A3) used in the present invention is a resin which has a Cardo structure, that is, a skeletal structure with two cyclic structures bonded to a quaternary carbon atom which forms a cyclic structure. A general form of a Cardo structure is a structure in which benzene rings bond to a fluorene ring.

As specific examples of a skeletal structure where two cyclic structures are bonded to a quaternary carbon atom forming a cyclic structure, a fluorene skeleton, bisphenol fluorene skeleton, bisaminophenyl fluorene skeleton, fluorine skeleton having an epoxy group, fluorene skeleton having an acryl group, etc. may be mentioned.

The Cardo resin (A3) used in the present invention is formed by polymerization by reacting functional groups which bond to skeletons having Cardo structure each other. The Cardo resin (A3) has a structure where the main chain and bulky side chains are connected by a single element (Cardo structure) and has a cyclic structure in the direction substantially vertical to the main chain.

As one example of the Cardo structure, an example of a Cardo structure having an epoxyglycidyl ether structure is shown in the following formula (3)

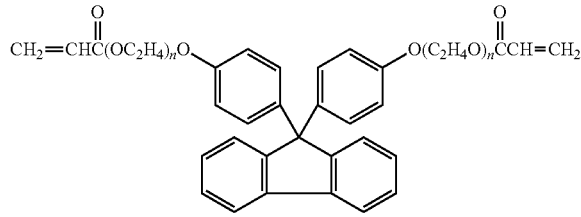

(3)

(In the above formula (3), "n" is an integer of 0 to 10.)

The monomer which has a Cardo structure is, for example, a bis(glycidyloxyphenyl)fluorene-type epoxy resin; a condensate of a bisphenolfluorene-type epoxy resin and acrylic acid; 9,9-bis(4-hydroxyphenyl) fluorene, 9,9-bis(4-hydroxy-3-methylphenyl) fluorene, or other Cardo structure-containing bisphenols; 9,9-bis(cyanomethyl) fluorene or other 9,9-bis(cyanoalkyl) fluorenes; 9,9-bis(3-aminopropyl) fluorene or other 9,9-bis(aminoalkyl) fluorenes; etc. may be mentioned.

The Cardo resin (A3) is a polymer which is obtained by polymerization of a monomer which has a Cardo structure, but may also be a copolymer with another copolymerizable monomer.

The polymerization method of the above monomers may be an ordinary method. For example, the ring-opening polymerization method or addition polymerization method etc. may be employed.

The polysiloxane (A4) used in the present invention is not particularly limited, but preferably a polymer which is obtained by mixing and reacting one or more types of organosilane represented by the following formula (4) may be mentioned.

$$(R^4)_m\text{—Si—}(OR^5)_{4-m} \tag{4}$$

In the above formula (4), $R^4$ is a hydrogen atom, $C_1$ to $C_{10}$ alkyl group, $C_2$ to $C_{10}$ alkenyl group, or $C_6$ to $C_{15}$ aryl group. The plurality of $R^4$ may be the same or different. Note that, these alkyl groups, alkenyl groups, and aryl groups may all have substituents. Further, they may be nonsubstituted groups which do not have substituents and may be selected in accordance with the properties of the composition. As specific examples of the alkyl group, a methyl group, ethyl group, n-propyl group, isopropyl group, n-butyl group, t-butyl group, n-hexyl group, n-decyl group, trifluoromethyl group, 2,2,2-trifluoroethyl group, 3,3,3-trifluoropropyl group, 3-glycidoxypropyl group, 2-(3,4-epoxy cyclohexyl) ethyl group, 3-aminopropyl group, 3-mercaptopropyl group, and 3-isocyanatepropyl group may be mentioned. As specific examples of the alkenyl group, a vinyl group, 3-acryloxypropyl group, and 3-methacryloxypropyl group may be mentioned. As specific example of the aryl group, a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group, and naphthyl group may be mentioned.

Further, in the above formula (4), $R^5$ is a hydrogen atom, $C_1$ to $C_6$ alkyl group, $C_1$ to $C_6$ acyl group, or $C_6$ to $C_{15}$ aryl group, where the plurality of $R^5$ may be the same or different. Note that, these alkyl groups and acyl groups may all have substituents. Further, they may be nonsubstituted groups which do not have substituents and may be selected in accordance with the properties of the composition. As specific examples of the alkyl group, a methyl group, ethyl group, n-propyl group, isopropyl group, and n-butyl group may be mentioned. As a specific example of the acyl group, an acetyl group may be mentioned. As a specific example of an aryl group, a phenyl group may be mentioned.

Furthermore, in the above formula (4), "m" is an integer of 0 to 3. When m=0, the compound becomes tetrafunctional silane, when m=1, it becomes trifunctional silane, when m=2, it becomes bifunctional silane, and when m=3, it becomes monofunctional silane.

As specific examples of an organosilane represented by the above formula (4), tetramethoxysilane, tetraethoxysilane, tetraacetoxysilane, tetraphenoxysilane, or other tetrafunctional silanes; methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyl triethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy) pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 2-(3,4-epoxycyclohexyl)ethyltrimethoxysilane, 3-mercaptopropyltrimethoxysilane, or other trifunctional silanes; dimethyldimethoxysilane, dimethyldiethoxysilane, dimethyldiacetoxysilane, di-n-butyldimethoxysilane, diphenyldimethoxysilane, or other bifunctional silanes; trimethylmethoxysilane, tri-n-butylethoxysilane, or other monofunctional silanes; may be mentioned.

Among these organosilanes, from the viewpoint of the crack resistance or hardness of the obtained resin film, trifunctional silanes are preferably used. These organosilanes may be used alone or may be used as two types or more combined.

The polysiloxane (A4) used in the present invention is obtained by the hydrolysis or partial condensation of the above-mentioned organosilanes. For the hydrolysis and partial condensation, general methods can be used. For example, a solvent, water, and according to need a catalyst are added to the mixture and heated and stirred. During stirring, in accordance with need, distillation may be used to distill off the hydrolysis byproducts (methanol or other alcohol) or condensation byproduct (water).

The polyimide (A5) used in the present invention can be obtained by heat treating a polyimide precursor obtained by reacting a tetracarboxylic anhydride and diamine. As the precursor for obtaining the polyimide, a polyamic acid, polyamic acid ester, polyisoimide, polyamic acid sulfonamide, etc. may be mentioned.

The polyimide (A5) used in the present invention is synthesized by a known method. That is, it is synthesized by a known method such as selectively combining tetracarboxylic dianhydride and a diamine and reacting these in N-methyl-2-pyrrolidone, N,N-dimethyl acetoamide, N,N-dimethylformamide, dimethylsulfoxide, hexamethylphosphoric triamide, γ-butyrolactone, cyclopentanone, or other polar solvent.

When excessively using a diamine for polymerization, it is possible to make a carboxylic anhydride react with the end amino group of the produced polyimide (A5) so as to protect the end amino group. Further, when excessively using tetracarboxylic anhydride for polymerization, it is possible to make an amine compound react with the end acid anhydride group of the produced polyimide (A5) so as to protect the end acid anhydride group.

As examples of such carboxylic anhydrides, phthalic anhydride, trimellitic anhydride, maleic anhydride, naphthalic anhydride, hydrogenated phthalic anhydride, methyl-5-norbornene-2,3-dicarboxylic anhydride, itaconic anhydride, tetrahydrophthalic acid anhydride, etc. may be mentioned, while as examples of amine compounds, aniline, 2-hydroxyaniline, 3-hydroxyaniline, 4-hydroxyaniline, 2-ethynylaniline, 3-ethynylaniline, 4-ethynylaniline, etc. may be mentioned.

The binder resin (A) used in the present invention has a weight average molecular weight (Mw) of usually 1,000 to 1,000,000, preferably 1,500 to 100,000, more preferably 2,000 to 10,000 in range.

Further, the binder resin (A) has a molecular weight distribution of a weight average molecular weight/number average molecular weight (Mw/Mn) ratio of usually 4 or less, preferably 3 or less, more preferably 2.5 or less.

The weight average molecular weight (Mw) and molecular weight distribution (Mw/Mn) of the binder resin (A) are values which are found by gel permeation chromatography (GPC) using tetrahydrofuran and other solvents as eluents and as values converted to polystyrene.

(Quinone Diazide-Based Photoacid Generator (B))

The quinone diazide-based photoacid generator (B) used in the present invention is a quinone diazide compound which generates an acid by irradiation of ultraviolet light or an electron beam or other radiation. The radiation-sensitive resin composition of the present invention contains a photoacid generator constituted by the quinone diazide-based photoacid generator (B), so usually acts as a positive-type radiation-sensitive resin composition.

As the quinone diazide-based photoacid generator (B) used in the present invention, for example, an ester compound of a quinone diazide sulfonic acid halide and a compound which has a phenolic hydroxyl group can be used. As specific examples of the quinone diazide sulfonic acid halide, 1,2-naphthoquinone diazide-5-sulfonic acid chloride, 1,2-naphthoquinone diazide-4-sulfonic acid chloride, 1,2-benzoquinone diazide-5-sulfonic acid chloride, etc. may be mentioned. As typical examples of a compound which has a phenolic hydroxyl group, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, etc. may be mentioned. As other compounds which have phenolic hydroxyl groups, 2,3,4-trihydroxybenzophenone, 2,3,4,4'-tetrahydroxybenzophenone, 2-bis(4-hydroxyphenyl) propane, tris(4-hydroxyphenyl) methane, 1,1,1-tris(4-hydroxy-3-methylphenyl) ethane, 1,1,2,2-tetrakis(4-hydroxyphenyl)ethane, oligomers of novolac resins, oligomers obtained by copolymerization of a compound which has one or more phenolic hydroxyl groups and dicyclopentadiene, etc. may be mentioned. Among these as well, a condensate of 1,2-naphthoquinone diazide-5-sulfonic acid chloride and a compound which has a phenolic hydroxyl group is preferable, while a condensate of 1,2-naphthoquinone diazide- 5-sulfonic acid chloride and 1,1,3-tris(2,5-dimethyl-4-hydroxyphenyl)-3-phenylpropane is more preferable.

In the radiation-sensitive resin composition of the present invention, the content of the quinone diazide-based photoacid generator (B) is preferably 10 to 100 parts by weight with respect to 100 parts by weight of the binder resin (A), more preferably 15 to 70 parts by weight, furthermore preferably 20 to 50 parts by weight. By making the content of the quinone diazide-based photoacid generator (B) this range, the resin film which is obtained using the radiation-sensitive resin composition of the present invention can be made excellent in exposure sensitivity, shape retention after firing, and transparency with a good balance.

((Meth)Acrylate Compound (C))

The (meth)acrylate compound (C) used in the present invention is not particularly limited so long as an ester compound of (meth)acrylic acid (meaning acrylic acid and/or methacrylic acid, same below), but, for example, a monofunctional acrylate, bifunctional acrylate, trifunctional or higher functional polyfunctional acrylate, monofunctional methacrylate, bifunctional methacrylate, and trifunctional or higher functional polyfunctional methacrylate may be mentioned. In the present invention, by jointly using the (meth)acrylate compound (C) and later explained photopolymerization initiator (D), the resin film which is obtained using the radiation-sensitive resin composition of the present invention can be made excellent in adhesion to a substrate.

As a specific example of the monofunctional acrylate, methyl acrylate, ethyl acrylate, n-propyl acrylate, glycidyl acrylate, 2-isocyanate ethyl acrylate, 2-acryloxyethyl trimethoxysilane, 2-acryloxyethyl triethoxysilane, 3-acryloxypropyl trimethoxysilane, 3-acryloxypropylmethyl dimethoxysilane, 3-acryloxypropyl triethoxysilane, 4-acryloxybutyl trimethoxysilane, 4-acryloxybutyl triethoxysilane, (3-methyl-3-oxetanyl)methyl acrylate, dicyclopentenyl acrylate (for example, product name "FA-511AS", made by Hitachi Chemical), dicyclopentenyloxyethyl acrylate (for example, product name "FA-512AS", made by Hitachi Chemical), dicyclopentanyl acrylate (for example, product name "FA-513AS", made by Hitachi Chemical), benzyl acrylate (for example, product name "FA-BZA", made by Hitachi Chemical), nonyl phenoxypolyethylene glycol acrylate (for example, made by Hitachi Chemical), β-carboxyethyl acrylate (for example, product name "β-CEA", made by Daicel Cytec), isobornyl acrylate (for example, product name "IBOA", made by Daicel Cytec, or product name "Light Acrylate IB-XA", made by Kyoei Kagaku Kogyo), octyl/decyl acrylate (for example, product name "ODA-N", made by Daicel Cytec), ethoxylated phenyl acrylate (for example, made by Daicel Cytec), isoamyl acrylate (for example, product name "Light Acrylate IAA", made by Kyoei Kagaku Kogyo), lauryl acrylate (for example, product name "Light Acrylate L-A", made by Kyoei Kagaku Kogyo), stearyl acrylate (for example, product name "Light Acrylate S-A", made by Kyoei Kagaku Kogyo), ethoxydiethyleneglycol acrylate (for example, product name "Light Acrylate EC-A", made by Kyoei Kagaku Kogyo), methoxytriethylene glycol acrylate (for example, product name "Light Acrylate MIG-A", made by Kyoei Kagaku Kogyo), 2-ethylhexyl-diglycol acrylate (for example, product name "Light Acrylate EHDG-AT", made by Kyoei Kagaku Kogyo), methoxy-polyethylene glycol acrylate (for example, product name "Light Acrylate 130A", made by Kyoei Kagaku Kogyo), methoxydipropylene glycol acrylate (for example, product name "Light Acrylate DPM-A", made by Kyoei Kagaku Kogyo), phenoxyethyl acrylate (for example, product name "Light Acrylate PO-A", made by Kyoei KagakuKogyo), phenoxydiethylene glycol acrylate (for example, product name "Light Acrylate P2H-A", made by Kyoei Kagaku Kogyo), phenoxy-polyethylene glycol acrylate (for example, product name "Light Acrylate P-200A", made by Kyoei Kagaku Kogyo), nonylphenol EO adduct acrylate (for example, product name "Light Acrylate NP-4EA", made by Kyoei Kagaku Kogyo), tetrahydrofurfuryl acrylate (for example, product name "Light Acrylate THF-A", made by Kyoei Kagaku Kogyo), 2-hydroxyethyl acrylate (for example, product name "Light Ester HOA (N)", made by Kyoei Kagaku Kogyo), 2-hydroxypropyl acrylate (for example, product name "Light Ester HOP-A(N)", made by Kyoei Kagaku Kogyo), 2-hydroxybutyl acrylate (for example, product name "Light Acrylate HOB-A", made by Kyoei Kagaku Kogyo), 2-hydroxy-3-phenoxypropyl acrylate (for example, product name "Epoxy Ester M-600A", made by Kyoei Kagaku Kogyo), 2-acryloyloxyethyl succinic acid (for example, product name "HOA-MS (N)", made by Kyoei Kagaku Kogyo), 2-acryloyloxyethyl hexahydrophthalic acid (for example, product name "Light Acrylate HOA-(N)", made by Kyoei Kagaku Kogyo), 2-acryloyloxyethyl phthalic acid (for example, product name "HOA-MPL(N)", made by Kyoei Kagaku Kogyo), 2-acryloyloxyethyl-2-hydroxyethyl phthalic acid (for example, product name "HOA-MPE (N)", made by Kyoei Kagaku Kogyo), neopentylglycol-acrylate-benzoic acid ester (for example, product name "Light Acrylate BA-104", made by Kyoei Kagaku Kogyo), 2-acryloyloxyethyl acid phosphate (for example, product name "Light Acrylate P-1A (N)", made by Kyoei Kagaku Kogyo), ethoxylated o-phenylphenol acrylate (for example, product name "A-LEN-10", made by Shin-Nakamura Chemical), methoxypolyethylene glycol acrylate (for example, product name "AM-90G", made by Shin-Nakamura Chemical), phenoxypolyethylene glycol acrylate (for example, product name "AMP-20GY", made by Shin-Nakamura Chemical), 2-acryloyloxyethyl succinate (for example, product name "A-SA", made by Shin-Nakamura Chemical), isostearyl acrylate (for example, product name "S-1800A", made by Shin-Nakamura Chemical), phenol EO modified acrylate (for example, product name "Aronix M-101A", made by Toagosei), o-phenylphenol EO modified acrylate (for example, product name "Aronix M-106", made by Toagosei), p-cumylphenol EO modified acrylate (for example, product name "Aronix M-110", made by Toagosei), nonylphenol EO modified acrylate (for example, product name "Aronix M-111", made by Toagosei), 2-ethylhexyl HD modified acrylate (for example, product name "Aronix M-120", made by Toagosei), N-acryloyloxyethyl hexahydrophthalimide (for example, product name "Aronix M-140", made by Toagosei), ω-carboxy-polycaprolactone monoacrylate (for example, product name "Aronix M-5300", made by Toagosei), phthalic acid monohydroxyethyl acrylate (for example, product name "Aronix M-5400", made by Toagosei), 2-hydroxy-3-phenoxypropyl acrylate (for example, product name "Aronix M-5700", made by Toagosei), etc. may be mentioned.

Further, as specific examples of the bifunctional acrylate, nonanediol diacrylate (for example, product name "FA-129AS", made by Hitachi Chemical), polypropylene glycol acrylate (for example, made by Hitachi Chemical), EO modified bisphenol A diacrylate (for example, product name "FA-324A", made by Hitachi Chemical), dipropylene glycol diacrylate (for example, product name "DPGDA", made by Daicel Cytec), 1,6-hexanediol diacrylate (for example, product name "HDDA", made by Daicel Cytec), tripropylene glycol diacrylate (for example, product name "TPGDA", made by Daicel Cytec), PO modified neopentyl glycol diacrylate (for example, product name "EBECRYL145", made by Daicel Cytec), modified bisphenol A diacrylate (for example, product name "EBECRYL150", made by Daicel Cytec), tricyclodecanedimethanol diacrylate (for example, product name "IRR214-K", made by Daicel Cytec), PEG400 diacrylate (for example, product name "PEG400DA", made by Daicel Cytec), neopentylglycol hydroxypivalic acid ester diacrylate (for example, product name "HPNDA", made by Daicel Cytec), triethylene glycol diacrylate (for example, product name "Light Acrylate 3EG-A", made by Kyoei Kagaku Kogyo), PEG diacrylate polytetramethylene glycol diacrylate (for example, product name "Light Acrylate FTPEA-250", made by Kyoei Kagaku Kogyo), neopentyl glycol diacrylate (for example, product name "Light Acrylate NP-A", made by Kyoei Kagaku Kogyo), 3-methyl-1,5-pentanediol diacrylate (for example, product name "Light Acrylate MPD-A", made by Kyoei Kagaku Kogyo), 1,6-hexanediol diacrylate (for example, product name "Light Acrylate 1,6HX-A", made by Kyoei Kagaku Kogyo), 1,9-nonanediol diacrylate (for example, product name "Light Acrylate 1,9ND-A", made by Kyoei Kagaku Kogyo), mixture of 2-methyl-1,8-octanediol diacrylate and 1,9-nonanediol diacrylate (for example, product name "Light Acrylate MOD-A", made by Kyoei Kagaku Kogyo), dimethylol tricyclodecane diacrylate (for example, product name "Light Acrylate DCP-A", made by Kyoei Kagaku Kogyo), bisphenol A EO adduct diacrylate (for example, product name "Light Acrylate BP-4EAL", made by Kyoei Kagaku Kogyo), bisphenol A PO adduct diacrylate (for example, product name "Light Acrylate BP-4PA", made by Kyoei Kagaku Kogyo), hydroxypivalic acid neopentylglycol acrylate adduct (for example, product name "Light Acrylate HPP-A", made by Kyoei Kagaku Kogyo), 2-hydroxy-3-acryloyloxypropyl methacrylate (for example, product name "701A", made by Shin-Nakamura Chemical), polyethylene glycol diacrylate (for example, made by Shin-Nakamura Chemical), propoxylated ethoxylated bisphenol A diacrylate (for example, product name "A-B1206PE", made by Shin-Nakamura Chemical), ethoxylated bisphenol A diacrylate 9,9-bis[4-(2-acryloyloxyethoxy)phenyl]fluorene (for example, product name "A-BPEF", made by Shin-Nakamura Chemical), propoxylated bisphenol A diacrylate (for example, product name "A-BPP-3", made by Shin-Nakamura Chemical), tricyclodecanedimethanol diacrylate (for example, product name "A-DCP", made by Shin-Nakamura Chemical), 1,6-hexanediol diacrylate (for example, product name "A-FID-N", made by Shin-Nakamura Chemical), 1,9-nonanediol diacrylate (for example, product name "A-NOD-N", made by Shin-Nakamura Chemical), dipropylene glycol diacrylate (for example, product name "APG-100", made by Shin-Nakamura Chemical), tripropyleneglycol diacrylate (for example, product name "APG-200", made by Shin-Nakamura Chemical), polypropylene glycol diacrylate polytetramethylene glycol diacrylate (for example, made by Shin-Nakamura Chemical), bisphenol F EO modified diacrylate (for example, product name "Aronix M-208", made by Toagosei), bisphenol A EO modified diacrylate (for example, product name "Aronix M-211B", made by Toagosei), isocyanuric acid EO modified diacrylate (for example, product name "Aronix M-215", made by Toagosei), polypropylene glycol diacrylate (for example, product name "Aronix M-220", made by Toagosei), polyethylene glycol diacrylate (for example, product name "Aronix M-240", made by Toagosei), etc. may be mentioned.

Further, as specific examples of the trifunctional or higher functional polyfunctional acrylate, tris(2-acryloyloxyethyl) isocyanurate (for example, product name "FA-731A", made by Hitachi Chemical), pentaerythritol triacrylate (trifunctional) (for example, product name "PETIA", made by Daicel Cytec), trimethylolpropane triacrylate (trifunctional) (for example, product name "TMPTA", made by Daicel Cytec), trimethylolpropane ethoxy triacrylate (trifunctional) (for example, product name "TMPEOTA", made by Daicel Cytec), glycerin propoxy triacrylate (trifunctional) (for example, product name "OTA 480", made by Daicel Cytec), dipentaerythritol hexacrylate (hexafunctional) (for example, product name "DPHA", made by Daicel Cytec, or product name "Light Acrylate DPE-6A", made by Kyoei Kagaku Kogyo, or product name "A-DPH", made by Shin-Nakamura Chemical), pentaerythritolethoxy tetraacrylate (tetrafunctional) (for example, product name "EBECRYL40", made by Daicel Cytec), trimethylolpropane triacrylate (trifunctional) (for example, product name "Light Acrylate TMP-A", made by Kyoei Kagaku Kogyo), pentaerythritol triacrylate (trifunctional) (for example, product name "Light Acrylate PE-3A", made by Kyoei Kagaku Kogyo), ethoxylated isocyanuric acid triacrylate (trifunctional) (for example, product name "A-9300", made by Shin-Nakamura Chemical), s-caprolactone modified tris-(2-acryloxyethyl) isocyanurate (trifunctional) (for example, product name "A-9300-1CL", made by Shin-Nakamura Chemical), ethoxylated glycerin triacrylate (trifunctional) (for example, made by Shin-Nakamura Chemical), ditrimethylolpropane tetraacrylate (tetrafunctional) (for example, product name "AD-TMP", made by Shin-Nakamura Chemical), ethoxylated pentaerythritol tetraacrylate (tetrafunctional) (for example, product name "ATM-35E", made by Shin-Nakamura Chemical), pentaerythritol tetraacrylate (tetrafunctional) (for example, product name "A-TMMT", made by Shin-Nakamura Chemical), dipentaerythritol polyacrylate (for example, product name "A-9550", made by Shin-Nakamura Chemical), trimethylolpropane PO modified triacrylate (trifunctional) (for example, product name "Aronix M-310", made by Toagosei), trimethylolpropane EO modified triacrylate (trifunctional) (for example, product name "Aronix M-350", made by Toagosei), isocyanuric acid EO modified di/triacrylate (bifunctional and trifunctional mixture, corresponding to the above-mentioned bifunctional acrylate) (for example, product name "Aronix M-313 Di 30-40%", made by Toagosei), pentaerythritol tri/tetraacrylate (trifunctional and tetrafunctional mixture) (for example, product name "Aronix M-305 Tri 55-63%", or, product name "Aronix M-306 Tri 65-70%", made by Toagosei), dipentaerythritol penta/hexacrylate (pentafunctional and hexafunctional mixture) (for example, product name "Aronix M-402 Penta 30-40%", made by Toagosei), ditrimethylolpropane tetraacrylate (tetrafunctional) (for example, product name "Aronix M-408", made by Toagosei), diglycerin EO modified acrylate (for example, product name "Aronix M-460", made by Toagosei), polybasic acid modified acrylic oligomer (for example, product name "Aronix M-510", made by Toagosei), etc. may be mentioned.

Furthermore, as specific examples of the monofunctional methacrylate, methyl methacrylate, ethyl methacrylate, n-propyl methacrylate, glycidyl methacrylate, 2-hydroxyethyl methacrylate, 2-isocyanate ethyl methacrylate, isoboronyl methacrylate, 2-methacryloxyethyl trimethoxysilane, 2-methacryloxyethyl triethoxysilane, 3-methacryloxypropyl trimethoxysilane, 3-methacryloxypropylmethyl dimethoxysilane, 3-methacryloxypropyl triethoxysilane, 3-methacryloxymethyl diethoxysilane, 4-methacryloxybutyl trimethoxysilane, 4-methacryloxybutyl triethoxysilane, dicyclopentenyloxyethyl methacrylate (for example, product name "FA-512M", made by Hitachi Chemical), dicyclopentanyl methacrylate (for example, product name "FA-513M", made by Hitachi Chemical), pentamethylpiperidyl methacrylate (for example, product name "FA-711MM", made by Hitachi Chemical), tetramethylpiperidyl methacrylate (for example, product name "FA-712HM", made by Hitachi Chemical), methoxypolyethylene glycol methacrylate (for example, made by Hitachi Chemical), benzyl methacrylate (for example, product name "FA-BZM", made by Hitachi Chemical), 2-hydroxy-3-acryloyloxypropyl methacrylate (for example, product name "Light Ester G-201P", made by Kyoei Kagaku Kogyo), 2-methacryloyloxyethyl phthalic acid (for example, product name "CB-1", made by Shin-Nakamura Chemical), methoxypolyethylene glycol methacrylate, phenoxyethylene glycol methacrylate (for example, product name "PFEE-1G", made by Shin-Nakamura Chemical), stearyl methacrylate (for example, product name "S", made by Shin-Nakamura Chemical), 2-methacryloyloxyethyl succinate (for example, product name "SA", made by Shin-Nakamura Chemical), 3,4-epoxycyclohexylmethyl methacrylate (for example, product name "Cyclomer M100", made by Daicel), etc. may be mentioned.

Further, as specific examples of bifunctional methacrylate, 1,4-butanediol dimethacrylate (for example, product name "FA-124M", made by Hitachi Chemical), neopentyl glycol dimethacrylate (for example, product name "FA-125M", made by Hitachi Chemical), polyethylene glycol #200 dimethacrylate (for example, product name "FA-220M", made by Hitachi Chemical), a) modified bisphenol A dimethacrylate (for example, product name "FA-321M", made by Hitachi Chemical), a) modified polypropylene glycol #700 dimethacrylate (for example, product name "FA-023M", made by Hitachi Chemical), ethylene glycol dimethacrylate (for example, product name "1G", made by Shin-Nakamura Chemical), diethylene glycol dimethacrylate (for example, product name "2G", made by Shin-Nakamura Chemical), triethylene glycol dimethacrylate (for example, product name "3G", made by Shin-Nakamura Chemical), polyethylene glycol dimethacrylate (for example, made by Shin-Nakamura Chemical), 2,2-bis[4-(methacryloxyethoxy)phenyl]propane (for example, product name "BPE-80N", made by Shin-Nakamura Chemical), ethoxylated bisphenol A dimethacrylate (for example, made by Shin-Nakamura Chemical), tricyclodecane dimethanol dimethacrylate (for example, product name "DCP", made by Shin-Nakamura Chemical), 1,10-decanediol dimethacrylate (for example, product name "DOD-N", made by Shin-Nakamura Chemical), 1,6-hexanediol dimethacrylate (for example, product name "1-ID-N", made by Shin-Nakamura Chemical), 1,9-nonanediol dimethacrylate (for example, product name "NOD-N", made by Shin-Nakamura Chemical), neopentyl glycol dimethacrylate (for example, product name "NFA", made by Shin-Nakamura Chemical), ethoxylated polypropylene glycol dimethacrylate (for example, made by Shin-Nakamura Chemical), glycerin dimethacrylate (for example, product name "701", made by Shin-Nakamura Chemical), polypropylene glycol dimethacrylate (for example, made by Shin-Nakamura Chemical), etc. may be mentioned.

Further, as specific examples of the trifunctional or higher functional polyfunctional methacrylate, trimethylolpropane trimethacrylate (for example, product name "TMPT", made by Shin-Nakamura Chemical) etc. may be mentioned.

The above (meth)acrylate compound (C) may be used as single type alone or two or more types combined, but from the viewpoint of further raising the effect of including the (meth)acrylate compound (C), that is, the effect of improvement of adhesion to a substrate, it is preferable to use two or more (meth)acrylate compounds (C) combined. Further, among the above (meth)acrylate compounds (C), from the viewpoint of further raising the effect of addition, that is, the effect of improvement of adhesion to a substrate, it is preferable to use a tetrafunctional or higher functional (meth)acrylate, in particular, it is particularly preferable to use a tetrafunctional or higher functional (meth)acrylate and a monofunctional (meth)acrylate combined.

In the radiation-sensitive resin composition of the present invention, the content of the (meth)acrylate compound (C) is preferably 0.3 to 22 parts by weight with respect to 100 parts by weight of the binder resin (A), more preferably 0.5 to 19 parts by weight, furthermore preferably 1 to 10 parts by weight, particularly preferably 2 to 5 parts by weight. By making the content of the (meth)acrylate compound (C) this range, it is possible to make the adhesion to a substrate more excellent.

(Photopolymerization Initiator (D))

The photopolymerization initiator (D) used in the present invention is not particularly limited so long as a compound which causes a chemical reaction by light, but a radical generating type photopolymerization initiator which generates radicals due to light and thereby causes a chemical reaction is preferable. In particular, among radical generating type photopolymerization initiators, a compound which has a sensitivity with respect to 400 nm or less wavelength light and generates radicals and which causes a chemical reaction when being irradiated by 400 nm or less wavelength light, specifically ultraviolet light or electron beams and other radiation, is preferable.

As specific examples of such a radical generating type photopolymerization initiator, benzophenone, methyl o-benzoyl benzoate, 4,4-bis(dimethylamine)benzophenone, 4,4-bis(diethylamine)benzophenone, α-amino-acetophenone, 4,4-dichlorobenzophenone, 4-benzoyl-4-methyldiphenylketone, dibenzylketone, fluorene, 2,2-diethoxyacetophenone, 2,2-dimethoxy-2-phenylacetophenone, 2-hydroxy-2-methylpropiophenone, p-tert-butyldichloroacetophenone, thioxantone, 2-methyl thioxantone, 2-chlorothioxantone, 2-isopropyl thioxantone, diethyl thioxantone, benzyldimethylketal, benzylmethoxyethylacetal, benzoinmethyl ether, benzoinbutyl ether, anthraquinone, 2-tert-butylanthraquinone, 2-amylbutylanthraquinone, β-chloroanthraquinone, anthrone, benzanthrone, dibenzsuberon, methylene anthrone, 4-acidobenzylacetophenone, 2,6-bis(p-azidebenzylidene)cyclohexane, 2,6-bis(p-azidebenzylidene)-4-methylcyclohexanone, 2-phenyl-1,2-butadione-2-(o-methoxycarbonyl) oxime, 1-phenyl-propanedion-2-(o-ethoxycarbonyl) oxime, 1,3-diphenyl-propanetrione-2-(o-ethoxycarbonyl) oxime, 1-phenyl-3-ethoxy-propanetrione-2-(o-benzoyl) oxime, Michler's ketone, 2-methyl-1 [4-(methyl thio)phenyl]-2-morpholinopropan-1-one, 2-benzyl-2-dimethylamino-1-(4-morpholinophenyl)-butanone, naphthalenesulfonyl chloride, quinolinesulfonyl chloride, n-phenylthioacrylidone, 4,4-azobisisobutyronitrile, diphenyl disulfide, benzothiazole disulfide, triphenylphosphine, camphorquinone, N,N-octamethylenebisacridine, 2-(dimethylamino)-2-[(4-methylphenyl)methyl]-1-[4-(4-morpholinyl)phenyl]-1-butanone (product name "Irgacure 379E3", made by BASF), 1-hydroxy-cyclohexyl-phenyl-ketone (product name "IRGACURE 184", made by BASF), 2-hydroxy-1-{4-[4-(2-hydroxy-2-methyl-propionyl)-benzyl]phenyl}-2-methyl propan-1-one (product name "IRGACURE 127", made by BASF), 2-methyl-1-(4-methyl thiophenyl)-2-morpholinopropan-1-one (product name "IRGACURE 907", made by BASF), 1,7-bis(9-acridyl)-heptane (made by ADEKA, N1717), 1,2-octanedion, 1-[4-(phenylthio)-, 2-(o-benzoyloxime)] (made by BASF, OXE-01), ethanone, 1-[9-ethyl-6-(2-methylbenzoyl)-9H-carbazol-3-yl], 1-(o-acetyloxime) (made by BASF, OXE-02), carbon tetrachloride, tribromophenylsulfone, benzoin peroxide, eosin, methylene blue, and other photoreducing dyes and ascorbic acid or triethanolamine and other reducing agents in combination etc. may be mentioned. These may be used as single type alone or as two types or more combined.

In the radiation-sensitive resin composition of the present invention, the content of the photopolymerization initiator (D) is preferably 0.3 to 8 parts by weight with respect to 100 parts by weight of the binder resin (A), more preferably 0.5 to 6 parts by weight, furthermore preferably 0.7 to 4 parts by weight. By making the content of the photopolymerization initiator (D) this range, the adhesion to a substrate can be made more excellent.

(Cross-Linking Agent (E))

The radiation-sensitive resin composition of the present invention preferably further contains, in addition to the above-mentioned binder resin (A), quinone diazide-based photoacid generator (B), (meth)acrylate compound (C), and photopolymerization initiator (D), a cross-linking agent (E). As the cross-linking agent (E), one which forms a cross-linked structure between cross-linking agent molecules due to heating or one which reacts with the binder resin (A) to form a cross-linked structure between resin molecules may be mentioned, specifically, a compound which has two or more reactive groups may be mentioned. As such a reactive group, for example, an amino group, carboxy group, hydroxyl group, epoxy group, or isocyanate group may be mentioned. More preferably, it is an amino group, epoxy group, or isocyanate group. An amino group or epoxy group is particularly preferable.

The molecular weight of the cross-linking agent (E) is not particularly limited, but is usually 100 to 100,000, preferably 300 to 50,000, more preferably 500 to 10,000. The cross-linking agent (E) may be used as single type alone or as two types or more combined.

As specific examples of the cross-linking agent (E), hexamethylenediamine and other aliphatic polyamines; 4,4'-diaminodiphenyl ether, diaminodiphenyl sulfone, and other aromatic polyamines; 2,6-bis(4'-azidebenzal)cyclohexanone, 4,4'-diazidediphenyl sulfone, and other azides; nylon, polyhexamethylenediamine terephthalamide, polyhexamethyleneisophthalamide, and other polyamides; N,N,N',N',N",N"-(hexaalkoxyalkyl)melamine, and other melamines which may have a methylol group, imino group, etc. (product name "Cymel 303, Cymel 325, Cymel 370, Cymel 232, Cymel 235, Cymel 272, Cymel 212, Mycoat 506" (above, made by Cytec Industries) and other Cymel series and Mycoat series products); N,N',N",N"'-(tetraalkoxyalkyl)glycoluril, and other glycolurils which may have a methylol group, imino group etc. (product name "Cymel 1170" (above, made by Cytec Industries) and other Cymel series products); ethylene glycol di(meth)acrylate and other acrylate compounds; hexamethylene diisocyanate-based polyisocyanate, isophorone diisocyanate-based polyisocyanate, tolylene di isocyanate-based polyisocyanate, hydrated diphenylmethane diisocyanate, and other isocyanate-based compounds; 1,4-di-(hydroxymethyl)cyclohexane, 1,4-di-(hydroxymethyl) norbornane; 1,3,4-trihydroxycyclohexane; bisphenol A-type epoxy resin, bisphenol F-type epoxy resin, phenol novolac-type epoxy resin, cresol novolac-type epoxy resin, polyphenol-type epoxy resin, cyclic aliphatic epoxy resin, aliphatic glycidyl ether, epoxy acrylate polymer, and other epoxy compounds; may be mentioned.

Further, as specific examples of the epoxy compound, a tri functional epoxy compound which has a dicyclopentadiene structure (product name "XD-1000", made by Nippon Kayaku), a 1,2-epoxy-4-(2-oxiranyl)cyclohexane adduct of 2,2-bis(hydroxymethyl) 1-butanol (pentadecafunctional alicyclic epoxy resin having a cyclohexane structure and end epoxy groups, product name "EHPE3150", made by Daicel Chemical Industry), epoxylated 3-cyclohexene-1,2-dicarboxylic acid bis(3-cyclohexenylmethyl) modified ε-caprolactone (aliphatic cyclic trifunctional epoxy resin, product name "Epolide GT301", made by Daicel Chemical Industry), epoxylated butanetetracarboxylic acid tetrakis(3-cyclohexenylmethyl) modified ε-caprolactone (aliphatic cyclic tetrafunctional epoxy resin, product name "Epolide GT401", made by Daicel Chemical Industry), and other epoxy compounds having alicyclic structures;

aromatic amine-type polyfunctional epoxy compound (product name "H-434", made by Tohto Chemical Industry), cresol novolac-type polyfunctional epoxy compound (product name "EOCN-1020", made by Nippon Kayaku), phenol novolac-type polyfunctional epoxy compound (Epicoat 152, 154, made by Japan Epoxy Resin), polyfunctional epoxy compound having a naphthalene structure (product name EXA-4700, made by DIC), chain alkylpolyfunctional epoxy compound (product name "SR-TMP", made by Sakamoto Yakuhin Kogyo Co., Ltd.), polyfunctional epoxy polybutadiene (product name "Epolide PB3600", made by Daicel Chemical Industry), glycidyl polyether compound of glycerin (product name "SR-GLG", made by Sakamoto Yakuhin Kogyo Co., Ltd.), diglycerin polyglycidyl ether compound (product name "SR-ME", made by Sakamoto Yakuhin Kogyo Co., Ltd.), polyglycerin polyglycidyl ether compound (product name "SR-4GL", made by Sakamoto Yakuhin Kogyo Co., Ltd.), and other epoxy compounds not having an alicyclic structure; may be mentioned.

In the radiation-sensitive resin composition of the present invention, the content of the cross-linking agent (E) is not particularly limited and may be freely set considering the extent of heat resistance which is sought to the resin film which is obtained by using the radiation-sensitive resin composition of the present invention, but is preferably 3 to 70 parts by weight with respect to 100 parts by weight of the binder resin (A), more preferably 4 to 45 parts by weight, furthermore preferably 5 to 25 parts by weight. Whether the cross-linking agent (E) is too great or too small, the heat resistance tends to fall.

(Other Compounding Agents)

The radiation-sensitive resin composition of the present invention may further contain a solvent. The solvent is not particularly limited, but one known as a solvent of a resin composition, for example, acetone, methylethylketone, cyclopentanone, 2-hexanone, 3-hexanone, 2-heptanone 3-heptanone, 4-heptanone, 2-octanone, 3-octanone, 4-octanone, or other straight chain ketones; n-propyl alcohol, isopropyl alcohol, n-butyl alcohol, cyclohexanol, or other alcohols; ethyleneglycol dimethyl ether, ethyleneglycol diethyl ether, dioxane, or other ethers; ethyleneglycol monomethyl ether, ethyleneglycol monoethyl ether, or other alcohol ethers; propyl formate, butyl formate, propyl acetate, butyl acetate, methyl propionate, ethyl propionate, methyl butyrate, ethyl butyrate, methyl lactate, ethyl lactate, or other esters; cellosolve acetate, methylcellosolve acetate, ethylcellosolve acetate, propylcellosolve acetate, butylcellosolve acetate, or other cellosolve esters; propyleneglycol, propyleneglycol monomethyl ether, propylene glycol monomethyl ether acetate, propylene glycol monoethyl ether acetate, propylene glycol monobutyl ether, or other propylene glycols; diethylene glycol monomethyl ether, diethylene glycol monoethyl ether, diethylene glycol dimethyl ether, diethylene glycol diethyl ether, diethylene glycol methylethyl ether, or other diethylene glycols; γ-butyrolactone, γ-valerolactone, γ-caprolactone, γ-caprylolactone, or other saturated γ-lactones; trichloroethylene or other halogenated hydrocarbons; toluene, xylene, or other aromatic hydrocarbons; dimethylacetoamide, dimethylformamide, N-methylacetoamide, or other polar solvents; etc. may be mentioned. These solvents may be used alone or as two types or more combined. The content of the solvent is preferably 10 to 10000 parts by weight with respect to 100 parts by weight of the binder resin (A), more preferably 50 to 5000 parts by weight, furthermore preferably 100 to 1000 parts by weight in range. Note that, when the resin composition is made to include a solvent, the solvent is normally removed after forming the resin film.

Further, the radiation-sensitive resin composition of the present invention may contain, to an extent where the effects of the present invention are not inhibited, as desired a surfactant, acidic compound, coupling agent or its derivative, sensitizer, latent acid generator, antioxidant, photostabilizer, defoamer, pigment, dye, filler, and other compounding agents etc.

The surfactant is used to prevent striation, improve the development property, and for other purposes. As specific examples of the surfactant, polyoxyethylene lauryl ether, polyoxyethylene stearyl ether, polyoxyethylene oleyl ether, and other polyoxyethylene alkyl ethers; polyoxyethylene octylphenyl ether, polyoxyethylene nonyl phenyl ether, and other polyoxyethylene aryl ethers; polyoxyethylene dilaurate, polyoxyethylene distearate, and other polyoxyethylene dialkyl esters, and other nonion-based surfactants; fluorine-based surfactants; silicone-based surfactants; methacrylic acid copolymer-based surfactants; acrylic acid copolymer-based surfactants; etc. may be mentioned.

The coupling agent or its derivative has the effect of further raising the adhesion of a resin film comprised of the radiation-sensitive resin composition and the layers, including the semiconductor layer, which forms the semiconductor device substrate. As the coupling agent or its derivative, a compound which has one atom selected from a silicon atom, titanium atom, aluminum atom, and zirconium atom and has a hydrocarbyloxy group or hydroxyl group which bonds with that atom can be used.

As the coupling agent or its derivative, for example, tetraalkoxysilanes, trialkoxysilanes, dialkoxysilanes, silicon atom-containing compounds, titanium atom-containing compounds, aluminum atom-containing compounds, zirconium atom-containing compounds, etc. may be mentioned, but among these, trialkoxysilanes are preferable. As specific examples of the trialkoxysilanes, N-phenyl-3-aminopropyltrimethoxysilane, 3-glycidoxypropyltrimethoxysilane, etc. may be mentioned.

As specific examples of the sensitizer, 2H-pyrido-(3,2-b)-1,4-oxazin-3(4H)-ones, 10H-pyrido(3,2-b)-1,4-benzothiadines, urazoles, hydantoins, barbituric acids, glycine anhydrides, 1-hydroxybenzotriazoles, alloxans, maleimides, etc. may be mentioned.

As antioxidants, a phenol-based antioxidant, phosphorus-based antioxidant, sulfur-based antioxidant, lactone-based antioxidant, etc. used for a usual polymer can be used. For example, as phenols, 2,6-di-t-butyl-4-methylphenol, p-methoxyphenol, styrenated phenol, n-octadecyl-3-(3',5'-di-t-butyl-4'-hydroxyphenyl) propionate, 2,2'-methylene-bis(4-methyl-6-t-butylphenol), 2-t-butyl-6-(3'-t-butyl-5'-methyl-2'-hydroxybenzyl)-4-methylphenylacrylate, 4,4'-butylidene-bis-(3-methyl-6-t-butylphenol), 4,4'-thio-bis(3-methyl-6-t-butylphenol), pentaerythritol tetrakis[3-(3,5-di-t-butyl-4-hydroxyphenyl) propionate], alkylated bisphenol, etc. may be mentioned. As the phosphorus-based antioxidants, triphenyl phosphite and tris(nonylphenyl) phosphite may be mentioned, while as the sulfur-based ones, dilauryl thiodipropionate etc. may be mentioned.

As light stabilizers, benzophenone-based, salicyclic acid ester-based, benzotriazole-based, cyanoacrylate-based, metal complex-based, and other ultraviolet ray absorbers, hindered amine-based light stabilizers (HALS) and other stabilizers which trap radicals generated due to light may be used. Among these as well, a HALS is a compound which has a piperidine structure and is preferable since it causes little coloring with respect to a radiation-sensitive resin composition and is good in stability. As specific compounds, bis(2,2,6,6-tetramethyl-4-piperidyl) sebacate, 1,2,2,6,6-pentamethyl-4-piperidyl/tridecyl-1,2,3,4-butanetetracarboxylate, bis(1-octyloxy-2,2,6,6-tetramethyl-4-piperidyl) sebacate, etc. may be mentioned.

The method of preparation of the radiation-sensitive resin composition of the present invention is not particularly limited, but the ingredients forming the radiation-sensitive resin composition may be mixed by a known method.

The method of mixing is not particularly limited, but it is preferable to dissolve or disperse the components which form the radiation-sensitive resin composition in solvents and mix the solutions or dispersions. Due to this, the radiation-sensitive resin composition is obtained in the form of a solution or dispersion.

The method of dissolving or dispersing the components which form the radiation-sensitive resin composition in solvents may be an ordinary method. Specifically, this may be performed by stirring using a stirring bar and magnetic stirrer, high speed homogenizer, disperser, planetary stirrer, twin-screw stirrer, ball mill, triple roll, etc. Further, the ingredients may also be dissolved or dispersed in a solvent, then for example filtered using a filter with a pore size of 0.5 μm or so etc.

The solid content concentration of the radiation-sensitive resin composition of the present invention is usually 1 to 70 wt %, preferably 5 to 60 wt %, more preferably 10 to 50 wt %. If the solid content concentration is in this range, stability of dissolution, coatability, uniformity of thickness and flatness of the resin film which is formed, etc. are obtained in a high balance.

Further, in the radiation-sensitive resin composition of the present invention, the ratios of content of Na, Mg, Al, K, Ca, Cr, Mn, Fe, and Ni is preferably a weight ratio with respect to the total radiation-sensitive resin composition of preferably less than 500 ppb, more preferably less than 200 ppb, particularly preferably less than 100 ppb.

(Resin Film)

The resin film of the present invention can be obtained using the above-mentioned radiation-sensitive resin composition of the present invention. The resin film of the present invention is preferably obtained by the above-mentioned radiation-sensitive resin composition of the present invention being formed on the substrate.

As the substrate, for example, a printed circuit board, silicon wafer substrate, soda glass or other glass substrate, polyethylene naphthalate or other plastic substrate, etc. may be used. Among these as well, a soda glass substrate used for a display device provided with a touch panel structure or a polyethylene naphthalate substrate is preferably used.

The method of forming the resin film is not particularly limited, but for example the coating method, film lamination method, or other method can be used.

The coating method is, for example, the method of coating a radiation-sensitive resin composition, then drying by heating to remove the solvent. As the method of coating the radiation-sensitive resin composition, for example, the spray method, spin coat method, roll coat method, die coat method, doctor blade method, spin coat method, bar coat method, screen print method, and other various methods can be employed. The heating and drying conditions differ according to the type and ratio of the ingredients, but are usually 30 to 150° C., preferably 60 to 120° C. usually for 0.5 to 90 minutes, preferably 1 to 60 minutes, more preferably 1 to 30 minutes.

The film lamination method is a method comprising coating a radiation-sensitive resin composition on a resin film, metal film or other substrate for forming B-stage film, then heating and drying it to remove the solvent to obtain the B-stage film, then laminating this B-stage film. The heating and drying conditions may be suitably selected in accordance with the types and ratios of content of the ingredients, but the heating temperature is usually 30 to 150° C. and the heating time is usually 0.5 to 90 minutes. The film lamination may be performed by using a press laminator, press, vacuum laminator, vacuum press, roll laminator, and other press bonding machines.

The thickness of the resin film is not particularly limited, but may be suitably set in accordance with the application, but when the resin film is a protective film or insulating film of, for example, a touch panel structure of a display device provided with a touch panel structure, the thickness of the resin film is preferably 0.1 to 100 μm, more preferably 0.5 to 50 μm, furthermore preferably 0.5 to 30 μm.

Further, when the radiation-sensitive resin composition of the present invention includes a cross-linking agent (E), the resin film which is formed by the above-mentioned coating method or film lamination method can be cross-linked. This cross-linking may be performed by selecting a suitable method in accordance with the type of the cross-linking agent (E), but usually is performed by heating. The heating method, for example, may be one using a hot plate, oven, etc. The heating temperature is usually 180 to 250° C. The heating time is suitably selected in accordance with the area or thickness of the resin film, the equipment which is used, etc. For example, when using a hot plate, it is normally 5 to 60 minutes, while when using an oven, it is normally 30 to 90 minutes. The heating may be performed in accordance with need in an inert gas atmosphere. The inert gas may be one which does not contain oxygen and which does not oxidize a resin film. For example, nitrogen, argon, helium, neon, xenon, krypton, etc. may be mentioned. Among these as well, nitrogen and argon are preferable. In particular, nitrogen is preferable. In particular, inert gas with an oxygen content of 0.1 vol % or less, preferably 0.01 vol % or less, in particular nitrogen, is suitable. These inert gases may be respectively used alone or as two types or more combined.

Further, the resin film which is formed using the above-mentioned radiation-sensitive resin composition may be patterned if necessary. As the method of patterning a resin film, for example, the method of forming a resin film before patterning, irradiating active radiation at the resin film before patterning to form latent patterns, then bringing the resin film which has the latent patterns into contact with the developing solution to bring out the patterns etc. may be mentioned.

The active radiation is not particularly limited so long as able to activate the quinone diazide-based photoacid generator (B) contained in the radiation-sensitive resin composition and change the alkali solubility of the radiation-sensitive resin composition containing the quinone diazide-based photoacid generator (B). Specifically, ultraviolet light, g-rays or i-rays and other single wavelength ultraviolet light, KrF excimer laser light, ArF excimer laser light, and other light beams; electron beams and other particle beams; etc. may be used. As the method of selectively radiating active radiation in a pattern manner to form latent patterns, an ordinary method may be used. For example, the method of using a reduced projection exposure apparatus etc. to irradiate ultraviolet light, g-rays, i-rays, KrF excimer laser light, ArF excimer laser light, and other light beams through a desired mask pattern or the method of using an electron beam or other particle beam for lithography etc. may be used. When using light beams as active radiation, single wavelength light or mixed wavelength light may be used. The irradiation conditions may be suitably selected in accordance with the active radiation used, but, for example, when using wavelength 200 to 450 nm light beams, the amount of irradiation is normally 10 to 1,000 mJ/cm$^2$, preferably 50 to 500 mJ/cm$^2$ in range and is determined in accordance with the irradiation time and illuminance. After irradiating the active radiation in this way, in accordance with need, the resin film is heat treated at 60 to 130° C. or so in temperature for 1 to 2 minutes or so.

Next, the latent patterns which are formed in the resin film before patterning are developed to bring them out. As the developing solution, normally aqueous solutions of alkali compounds may be used. As alkali compounds, for example, alkali metal salts, amines, and ammonium salts may be used. The alkaline compounds may be inorganic compounds or organic compounds. As specific examples of these compounds, sodium hydroxide, potassium hydroxide, sodium carbonate, sodium silicate, metasodium silicate, and other alkali metal salts; ammonia water; ethylamine, n-propylamine, and other primary amines; diethylamine, di-n-propylamine, and other secondary amines; triethylamine, methyldiethylamine, and other tertiary amines; tetramethylammonium hydroxide, tetraethylammonium hydroxide, tetrabutylammonium hydroxide, choline, and other quaternary ammonium salts; dimethylethanolamine, triethanolamine, and other alcohol amines; pyrrol, piperidine, 1,8-diazabicyclo[5.4.0]undec-7-ene, 1,5-diazabicyclo [4.3.0]non-5-ene, N-methylpyrrolidone, and other cyclic amines; etc. may be mentioned. These alkali compounds may be respectively used alone or as two types or more combined.

As the aqueous medium which is used as the aqueous solution of an alkali compound, water; methanol, ethanol, and other water soluble organic solvents may be used. The alkali aqueous solution may have a surfactant etc. added in a suitable amount.

As the method for bringing the developing solution in contact with the resin film which has the latent patterns, for example, the puddle method, spray method, dipping method, and other methods may be used. The development conditions are suitably selected as normally 0 to 100° C., preferably 5 to 55° C., more preferably 10 to 30° C. and normally 30 to 180 seconds.

The resin film which is formed with the targeted patterns in this way may be rinsed by a rinse solution in accordance with need so as to remove development residue. After the rinse treatment, the remaining rinse solution is removed by compressed air or compressed nitrogen.

In the present invention, the resin film may be cross-linked after patterning. The cross-linking can be performed by the above-mentioned method.

(Electronic Device)

The electronic device of the present invention comprises the above-mentioned resin film of the present invention. The electronic device of the present invention is not particularly limited, but various electronic devices may be mentioned. Specifically, a touch pallet or flexible organic EL display or other display device provided with a touch panel structure etc. may be mentioned.

A display device provided with a touch panel structure of one example of an electronic device of the present invention is not particularly limited, but one comprised of a soda glass substrate or polyethylene naphthalate film on which an electrode layer comprised of a pair of ITO electrodes sandwiching an insulating film is arranged etc. may be mentioned. In this case, the above-mentioned resin film of the present invention can be used as an insulating film sandwiched between the electrode layers or a protective film for protecting the touch panel structure.

The radiation-sensitive resin composition of the present invention contains the binder resin (A), quinone diazide-based photoacid generator (B), (meth)acrylate compound (C), and photopolymerization initiator (D), so the resin film which is obtained using the radiation-sensitive resin composition of the present invention exhibits a high adhesion to a substrate and is excellent in transparency, photosensitivity, and chemical resistance. In particular, the resin film which is obtained using the radiation-sensitive resin composition of the present invention exhibits excellent adhesion to a soda glass substrate or polyethylene naphthalate film or other substrate which is used for a display provided with a touch panel structure. For this reason, the resin film which is obtained using the radiation-sensitive resin composition of the present invention can be suitably used as an insulating film or protective film of a display device provided with a touch panel structure.

EXAMPLES

Below, examples and comparative examples will be given to more specifically explain the present invention. In the examples, "parts" are based on weight unless otherwise indicated.

Note that, the definitions and methods of evaluation of the properties were as follows.

<Adhesion>

A soda glass substrate was coated with a radiation-sensitive resin composition by the spin coat method and prebaked using a hot plate at 110° C. for 2 minutes. Next, a 2.38 wt % tetramethylarmonium hydroxide aqueous solution was used to develop the composition at 23° C. for 30 seconds, then ultrapure water was used for rinsing for 30 seconds. Next, ultraviolet light of a light intensity at 365 nm of 50 mJ/cm$^2$ was irradiated for 300 seconds in the air. Next, an oven was used to heat the film in a nitrogen atmosphere at 230° C. for 30 minutes as post-baking to thereby obtain a resin film-coated substrate comprised of a resin film and a soda glass substrate. Note that, when forming the resin film, the speed at the time of spin coating was controlled so that the film thickness after post-baking becomes about 2.0 µm. The obtained resin film-coated substrate was stored in an environment of a temperature of 80° C. and a humidity of 85% for 24 hours, then the surface and interfacial cutting analysis method (SAICAS method) was used to test for the adhesion (peeling strength).

Specifically, the resin film part of the above obtained resin film-coated substrate was formed with a cut of 1 mm width by a cutter. A blade (made by 1.0 ran width, rake angle 20°, relief angle 10° monocrystalline diamond) was used to cut the sample at a horizontal speed of 0.2 µm/sec and a vertical speed of 0.02 µm/sec, and measured the adhesion using a measuring device constituted by a Saicas DN-20 model made by Daipla Wintes. When the blade cut to the interface between the resin film and the soda glass surface, the vertical speed was reduced to 0 µm/sec and the blade was made to move parallel to the substrate to measure the horizontal force FH [N]. Further, from the width w [m] of the blade, the peeling strength P was found from the calculation formula "P[N/m]=FI-1[N]/w[m]". The peeling strength P was made the value of adhesion between the resin film and the soda glass substrate. In the examples, 50 N/m or more was deemed as "good".

<Transparency>

A resin film-coated substrate which was prepared using an alkali-free glass substrate by a method similar to the evaluation of the above adhesion was used to measure transmittance in the range of wavelength 400 nm to 700 nm at 1 nm intervals using a spectrophotometer (made by JASCO, "Ultraviolet Visible Spectrophotometer V-560 (product name)"). The average of the total transmittance in the range of 400 nm to 700 nm which was obtained was measured as the transparency. Note that the transparency was evaluated by the following criteria.

Good: total transmittance of 95% or more
Poor: total transmittance of less than 95%

<Chemical Resistance>

The resin film-coated substrate which was used for the above evaluation of adhesion was dipped in a solvent constituted by a mixture of monoethanolamine and N-methylpyrrolidone in a weight ratio of 7:3 at 65° C. for 5 minutes. The rate of change of thickness of the resin film before and after dipping was measured to evaluate the chemical resistance. Note that, the rate of change of thickness of resin film before and after dipping was calculated in accordance with "rate of change of thickness of resin film before and after dipping (%)=(|thickness of resin film after dipping-thickness of resin film before dipping|/thickness of resin film before dipping)×100". Further, the chemical resistance was evaluated by the following criteria.

Good: rate of change of thickness of resin film before and after dipping of less than 3.0%
Fair: rate of change of thickness of resin film before and after dipping of 3.0% to less than 5.0%
Poor: rate of change of thickness of resin film before and after dipping of 5.0% or more <Exposure Sensitivity>

A soda glass substrate was coated with a radiation-sensitive resin composition by the spin coat method then was prebaked using a hot plate at 110° C. for 2 minutes to form a thickness 2.6 µm resin film. Next, a 2.38 wt % tetramethylammonium hydroxide aqueous solution was used to develop the composition at 23° C. for 30 seconds, then this was rinsed with ultrapure water for 30 seconds. Next, to pattern the resin film, a mask able to form 5 µm contact hole patterns was used and the amount of exposure was changed from 100 mJ/cm$^2$ to 250 mJ/cm$^2$ every 50 mJ/cm$^2$ to perform an exposure process in the air. Next, an oven was used to heat the film in a nitrogen atmosphere at 230° C. for 30 minutes as post-baking to thereby obtain a laminate of a resin film which has contact hole patterns with different amounts of exposure and a soda glass substrate.

Further, an optical microscope was used to examine the part of the obtained laminate at which contact holes were formed. The lengths of the longest parts of the contact hole patterns of the resin film at the parts exposed by the different exposure amounts were measured. Then, an approximation curve was prepared from the relationship between the amounts of exposure and the lengths of the longest parts of the contact hole patterns of the resin film formed at the corresponding amounts of exposure, the amount of exposure at the time when the contact hole patterns became 5 μm was calculated, and the amount of exposure was calculated as the exposure sensitivity. The lower the amount of exposure when the contact hole patterns were 5 μm, the lower the energy or the shorter the time by which contact holes can be formed, so the more preferable.

Good: amount of exposure when contact hole patterns become 5 μm is less than 200 mJ/cm$^2$ Fair: amount of exposure when contact hole patterns become 5 μm is 200 mJ/cm$^2$ to less than 250 mJ/cm$^2$ Poor: amount of exposure when contact hole patterns become 5 μm is 250 mJ/cm$^2$ or more Synthesis Example 1

<Preparation of Cyclic Olefin Polymer (A-1)>

100 parts of monomer mixture comprised of 40 mol % of N-phenyl-bicyclo[2.2.1]hept-5-ene-2,3-dicarboxyimide (NBPI) and 60 mol % of 4-hydroxycarbonyltetracyclo [6.2.1.1$^{3,6}$.0$^{2,7}$]dodec-9-ene (TCDC), 2.0 parts of 1,5-hexadiene, 0.02 part of (1,3-dimesitylimidazolin-2-ylidene) (tricyclohexylphosphine)benzylidene ruthenium dichloride (synthesized by method described in Org. Lett., vol. 1, pp. 953, 1999), and 200 parts of diethyleneglycolethylmethyl ether were charged into a nitrogen-substituted glass pressure-resistant reactor and stirred while making them react at 80° C. for 4 hours to obtain a polymerization reaction solution.

Further, the obtained polymerization reaction solution was placed in an autoclave and stirred at 150° C. at a hydrogen pressure 4 MPa for 5 hours for a hydrogenation reaction to obtain a polymer solution which contains a cyclic olefin polymer (A-1). The polymerization conversion rate of the obtained cyclic olefin polymer (A-1) was 99.7%, the weight average molecular weight converted to polystyrene was 7,150, the number average molecular weight was 4,690, the molecular weight distribution was 1.52, and the hydrogenation rate was 99.7%. Further, the solid content concentration of the polymer solution of the obtained cyclic olefin polymer (A-1) was 34.4 wt %.

Synthesis Example 2

<Preparation of Acrylic Resin (A-2)>

20 parts of styrene, 25 parts of butyl methacrylate, 25 parts of 2-ethylhexylacrylate, 30 parts of methacrylate, 0.5 part of 2,2-azobisisobutyronitrile, and 300 parts of propyleneglycolmonomethyl ether acetate were stirred in a nitrogen stream while heating at 80° C. for 5 hours. The obtained resin solution was concentrated by a rotary evaporator to obtain a solid content concentration 35 wt % acrylic resin (A-2) polymer solution.

Example 1

291 parts of polymer solution of the cyclic olefin polymer (A-1) obtained in Synthesis Example 1 (as cyclic olefin polymer (A-1), 100 parts) as a binder resin (A), 32 parts of condensate of 1,1,3-tri s (2,5-dimethyl-4-hydroxyphenyl)-3-phenylpropane (1 mole) and 1,2-naphthoquinone diazide-5-sulfonic acid chloride (2.0 moles) (product name "TS200", made by Toagosei) as a quinone diazide-based photoacid generator (B), 3 parts of dipentaerythritol penta/hexacrylate (product name "Aronix M-402 Penta 30-40 wt %", made by Toagosei) as a (meth)acrylate compound (C), 1 part of 2-hydroxy-1-{4-[4-(2-hydroxy-2-methyl-propionyl)benzyl] phenyl}-2-methylpropan-1-one (product name "Irgacure 127", made by BASF) as a photopolymerization initiator (D), 10 parts of epoxylated butanetetracarboxylic acid tetrakis(3-cyclohexenylmethyl) modified ε-caprolactone (aliphatic cyclic tetrafunctional epoxy resin, product name "Epolide GT401", made by Daicel Chemical Industry) as a cross-linking agent (E), 0.03 part of a silicone-based surfactant (product name "KP-341", made by Shin-Etsu Chemical), and 270 parts of ethyleneglycolethylmethyl ether as a solvent were mixed and made to dissolve, then the mixture was filtered by a pore size 0.45 μm polytetrafluoroethylene filter to prepare a solid content concentration 24.1 wt % radiation-sensitive resin composition.

Further, the above obtained radiation-sensitive resin composition was used in accordance with the above method to evaluate the adhesion, transparency, chemical resistance, and exposure sensitivity. The results are shown in Table 1.

Examples 2 to 5

Except for changing the content of the dipentaerythritol penta/hexacrylate as the (meth)acrylate compound (C) from 3 parts to 0.3 part (Example 2), 1 part (Example 3), 7 parts (Example 4), and 15 parts (Example 5), the same procedures were followed as in Example 1 to prepare solid content concentration 23.7 wt %, 23.8 wt %, 24.6 wt %, and 25.5 wt % radiation-sensitive resin compositions and the same procedures were followed to evaluate them. The results are shown in Table 1.

Example 6

Except for using as the (meth)acrylate compound (C), instead of 3 parts of dipentaerythritol penta/hexacrylate, 3 parts of pentaerythritol/tetraacrylate (product name "Aronix M-305 Tri 55-63 wt %", made by Toa Gosei), the same procedure was followed as in Example 1 to prepare a solid content concentration 24.1 wt % radiation-sensitive resin composition and the same procedure was followed to evaluate it. The results are shown in Table 1.

Example 7

Except for using as the (meth)acrylate compound (C), instead of 3 parts of dipentaerythritol penta/hexacrylate, 3 parts of trimethylolpropane triacrylate (product name "Aronix M-309", made by Toagosei), the same procedure was followed as in Example 1 to prepare a solid content concentration 24.1 wt % radiation-sensitive resin composition and the same procedure was followed to evaluate it. The results are shown in Table 1.

Example 8

Except for using as the (meth)acrylate compound (C), instead of 3 parts of dipentaerythritol penta/hexacrylate, 3 parts of benzyl acrylate (product name "Fancryl FA-BZA", made by Hitachi Chemical), the same procedure was followed as in Example 1 to prepare a solid content concentration 24.1 wt % radiation-sensitive resin composition and the same procedure was followed to evaluate it. The results are shown in Table 1.

Example 9

Except for further using as the (meth)acrylate compound (C), in addition to 3 parts of dipentaerythritol penta/hexacrylate, 2 parts of 3-methacryloxypropyltrimethoxysilane (product name "ICBM-503", made by Shin-Etsu Chemical), the same procedure was followed as in Example 1 to prepare a solid content concentration 24.3 wt % radiation-sensitive resin composition and the same procedure was followed to evaluate it. The results are shown in Table 1.

Example 10

Except for further using as the (meth)acrylate compound (C), in addition to 3 parts of dipentaerythritol penta/hexacrylate, 2 parts of 3,4-epoxycyclohexylmethyl methacrylate (product name "Cyclomer M100", made by Daicel), the same procedure was followed as in Example 1 to prepare a solid content concentration 24.6 wt % radiation-sensitive resin composition and the same procedure was followed to evaluate it. The results are shown in Table 1.

Example 11

Except for further using as the (meth)acrylate compound (C), in addition to 3 parts of dipentaerythritol penta/hexacrylate, 2 parts of 3-methacryloxypropyltrimethoxysilane and 2 parts of 3,4-epoxycyclohexylmethyl methacrylate, the same procedure was followed as in Example 1 to prepare a solid content concentration 24.6 wt % radiation-sensitive resin composition and the same procedure was followed to evaluate it. The results are shown in Table 1.

Examples 12 and 13

Except for changing the content of the (meth)acrylate compound (C) constituted by dipentaerythritol penta/hexacrylate from 3 parts to 11 parts (Example 12) and 18 parts (Example 13), the same procedures were followed as in Example 11 to prepare solid content concentration 25.5 wt % and 26.4 wt % radiation-sensitive resin compositions and the same procedures were followed to evaluate them. The results are shown in Table 1.

Example 14

Except for using as the binder resin (A), instead of 291 parts of the polymer solution of the cyclic olefin polymer (A-1), 285 parts of the polymer solution of the acrylic resin (A-2) obtained in Synthesis Example 2 (as cyclic acrylic resin (A-2), 100 parts), the same procedure was followed as in Example 1 to prepare a solid content concentration 24.3 wt % radiation-sensitive resin composition and the same procedure was followed to evaluate it. The results are shown in Table 1.

Comparative Example 1

Except for not mixing the (meth)acrylate compound (C) constituted by dipentaerythritol penta/hexacrylate, the same procedure was followed as in Example 1 to prepare a solid content concentration 23.7 wt % radiation-sensitive resin composition and the same procedure was followed to evaluate it. The results are shown in Table 1.

Comparative Example 2

Except for not mixing the (meth)acrylate compound (C) constituted by dipentaerythritol penta/hexacrylate and the photopolymerization initiator (D) constituted by 2-hydroxy-1-{4-[4-(2-hydroxy-2-methyl-propionyl)-benzyl]phenyl}-2-methyl-propan-1-one, the same procedure was followed as in Example 1 to prepare a solid content concentration 23.6 wt % radiation-sensitive resin composition and the same procedure was followed to evaluate it. The results are shown in Table 1.

Comparative Example 3

Except for not mixing the photopolymerization initiator (D) constituted by 2-hydroxy-1-{4-[4-(2-hydroxy-2-methyl-propionyl)benzyl]phenyl}-2-methylpropan-1-one, the same procedure was followed as in Example 1 to prepare a solid content concentration 23.9 wt % radiation-sensitive resin composition and the same procedure was followed to evaluate it. The results are shown in Table 1.

TABLE 1

| | | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Composition of radiation-sensitive resin composition | | | | | | | | | | | | |
| Cyclic olefin polymer (A-1) | (parts) | 100 | 100 | 100 | 100 | 100 | 100 | 100 | 100 | 100 | 100 | 100 |
| Acrylic resin (A-2) | (parts) | | | | | | | | | | | |
| Condensate of 1,1,3-tris(2,5-dimethyl-4-hydroxyphenyl)-3-phenylpropane (1 mole) and 1,2-naphthoquinone diazide-5-sulfonic acid chloride (2 moles) | (parts) | 32 | 32 | 32 | 32 | 32 | 32 | 32 | 32 | 32 | 32 | 32 |
| Dipentaerythritol penta/hexacrylate | (parts) | 3 | 0.3 | 1 | 7 | 15 | | | | 3 | 3 | 3 |
| Pentaerythritol tri/tetraacrylate | (parts) | | | | | | 3 | | | | | |
| Trimethylolpropane triacrylate | (parts) | | | | | | | 3 | | | | |
| Benzyl acrylate | (parts) | | | | | | | | 3 | | | |
| 3-methacryloxypropyl trimethoxysilane | (parts) | | | | | | | | | 2 | | 2 |
| 3,4-epoxycyclohexylmethyl methacrylate | (parts) | | | | | | | | | | 2 | 2 |

TABLE 1-continued

| | | Examples | | | | | | | | | | |
|---|---|---|---|---|---|---|---|---|---|---|---|---|
| 2-hydroxy-1-{4-[4-(2-hydroxy-2-methyl-propionyl)-benzyl]phenyl}-2-methyl-propan-1-one | (parts) | 1 | 1 | 1 | 1 | 1 | 1 | 1 | 1 | 1 | 1 | 1 |
| Epoxylated butanetetracarboxylic acid tetrakis (3-cyclohexenylmethyl) modified ε-caprolactone | (parts) | 10 | 10 | 10 | 10 | 10 | 10 | 10 | 10 | 10 | 10 | 10 |

Evaluation

| | | | | | | | | | | | | |
|---|---|---|---|---|---|---|---|---|---|---|---|---|
| Adhesion | (N/m) | 141 | 79 | 122 | 118 | 92 | 135 | 103 | 68 | 224 | 185 | 243 |
| Transparency | | Good | Good | Good | Good | Good | Good | Good | Good | Good | Good | Good |
| Chemical resistance | | Good | Good | Good | Good | Good | Good | Good | Good | Good | Good | Good |
| Exposure sensitivity | | Good | Good | Good | Good | Good | Good | Good | Good | Good | Good | Good |

| | | Examples | | | Comparative Examples | | |
|---|---|---|---|---|---|---|---|
| | | 12 | 13 | 14 | 1 | 2 | 3 |

Composition of radiation-sensitive resin composition

| | | | | | | | |
|---|---|---|---|---|---|---|---|
| Cyclic olefin polymer (A-1) | (parts) | 100 | 100 | | 100 | 100 | 100 |
| Acrylic resin (A-2) | (parts) | | | 100 | | | |
| Condensate of 1,1,3-tris(2,5-dimethyl-4-hydroxyphenyl)-3-phenylpropane (1 mole) and 1,2-naphthoquinone diazide-5-sulfonic acid chloride (2 moles) | (parts) | 32 | 32 | 32 | 32 | 32 | 32 |
| Dipentaerythritol penta/hexacrylate | (parts) | 11 | 18 | 3 | | | 3 |
| Pentaerythritol tri/tetraacrylate | (parts) | | | | | | |
| Trimethylolpropane triacrylate | (parts) | | | | | | |
| Benzyl acrylate | (parts) | 2 | 2 | | | | |
| 3-methacryloxypropyl trimethoxysilane | (parts) | 2 | 2 | | | | |
| 3,4-epoxycyclohexylmethyl methacrylate | (parts) | | | | | | |
| 2-hydroxy-1-{4-[4-(2-hydroxy-2-methyl-propionyl)-benzyl]phenyl}-2-methyl-propan-1-one | (parts) | 1 | 1 | 1 | 1 | | |
| Epoxylated butonetetracarboxylic acid tetrakis (3-cyclohexenylmethyl) modified ε-caprolactone | (parts) | 10 | 10 | 10 | 10 | 10 | 10 |

Evaluation

| | | | | | | | |
|---|---|---|---|---|---|---|---|
| Adhesion | (N/m) | 141 | 85 | 101 | 22 | 23 | 34 |
| Transparency | | Good | Good | Good | Good | Good | Good |
| Chemical resistance | | Good | Good | Good | Good | Good | Good |
| Exposure sensitivity | | Good | Good | Good | Good | Good | Good |

As shown in Table 1, a resin film which is obtained using a radiation-sensitive resin composition which contains a binder resin (A), quinone diazide-based photoacid generator (B), (meth)acrylate compound (C), and photopolymerization initiator (D) is high in adhesion to a substrate and is excellent in transparency, photosensitivity, and chemical resistance (Examples 1 to 14).

On the other hand, when not mixing in one or both of the (meth)acrylate compound (C) or photopolymerization initiator (D), the obtained resin film was low in adhesion to a substrate and not suited to applications where adhesion with respect to a substrate is demanded, for example, applications of a protective film or insulating film etc. of a touch pallet or flexible organic EL display (Comparative Examples 1 to 3).

The invention claimed is:

1. A radiation-sensitive resin composition containing cyclic olefin polymer which has a protonic polar group (A1), quinone diazide-based photoacid generator (B), (meth)acrylate compound (C), and photopolymerization initiator (D), wherein
   a content of the quinone diazide-based photoacid generator (B) is 15 to 100 parts by weight with respect to 100 parts by weight of the cyclic olefin polymer which has a protonic polar group (A1).

2. The radiation-sensitive resin composition according to claim 1 wherein a content of the (meth)acrylate compound (C) is 0.3 to 22 parts by weight with respect to 100 parts by weight of the cyclic olefin polymer which has a protonic polar group (A1).

3. The radiation-sensitive resin composition according to claim 1 wherein
   the photopolymerization initiator (D) is a radical generating type photopolymerization initiator, and
   a content of the photopolymerization initiator (D) is 0.3 to 8 parts by weight with respect to 100 parts by weight of the cyclic olefin polymer which has a protonic polar group (A1).

4. The radiation-sensitive resin composition according to claim 1 wherein the (meth)acrylate compound (C) contains at least a tetrafunctional or higher functional (meth)acrylate.

5. The radiation-sensitive resin composition according to claim 4 wherein the (meth)acrylate compound (C) is a combination of a tetrafunctional or higher functional (meth)acrylate and a monofunctional (meth)acrylate.

6. The radiation-sensitive resin composition according to claim 1 further containing a cross-linking agent (E).

7. A resin film obtained using the radiation-sensitive resin composition according to claim 1.

8. An electronic device comprising the resin film according to claim 7.

9. A display device comprising a touch panel structure which is provided with an insulating film and/or protective film comprised of the resin film according to claim 7.

10. The radiation-sensitive resin composition according to claim 1 wherein a content of the (meth)acrylate compound (C) is 1 to 10 parts by weight with respect to 100 parts by weight of the cyclic olefin polymer which has a protonic polar group (A1).

* * * * *